(12) United States Patent
Boutin

(10) Patent No.: US 7,895,025 B2
(45) Date of Patent: Feb. 22, 2011

(54) VALIDATION METHOD FOR EMBEDDED SYSTEMS

(75) Inventor: Samuel Boutin, Magny-les-Hameaux (FR)

(73) Assignee: Renault S.A.S., Boulogne Billancourt (FR)

( * ) Notice: Subject to any disclaimer, the term of this patent is extended or adjusted under 35 U.S.C. 154(b) by 808 days.

(21) Appl. No.: 10/591,816

(22) PCT Filed: Mar. 10, 2005

(86) PCT No.: PCT/EP2005/002638

§ 371 (c)(1),
(2), (4) Date: Sep. 6, 2006

(87) PCT Pub. No.: WO2005/091177

PCT Pub. Date: Sep. 29, 2005

(65) Prior Publication Data

US 2007/0192076 A1 Aug. 16, 2007

(30) Foreign Application Priority Data

Mar. 10, 2004 (EP) .................................. 04300130

(51) Int. Cl.
*G06G 7/62* (2006.01)

(52) U.S. Cl. .............................. 703/13; 700/29; 700/95; 703/2

(58) Field of Classification Search ................... 700/29, 700/95, 103, 104; 703/2, 13
See application file for complete search history.

(56) References Cited

U.S. PATENT DOCUMENTS 5,394,347 A * 2/1995 Kita et al. ....................... 703/2

FOREIGN PATENT DOCUMENTS

EP 1 085 417 3/2001

OTHER PUBLICATIONS

Giusto, Paolo et al., "Automotive Virtual Integration Platforms: Why's, What's, and How's", IEEE 2002.*
Avresky et al., "Fault Injection for the Formal Testing of Fault Tolerance", Fault-Tolerant Parallel and Distributed Systems, pp. 345-354, 1992.

* cited by examiner

*Primary Examiner*—Paul L Rodriguez
*Assistant Examiner*—Carlos Ortiz Rodriguez
(74) *Attorney, Agent, or Firm*—Oblon, Spivak, McClelland, Maier & Neustadt, L L P

(57) ABSTRACT

A method of designing a validation environment for a service implemented by an embedded electrical system. In the method one or more user requests and system responses are assigned. Next, a behavioral automata is assigned to the service, which fixes the allowed sequencing of the user requests and system responses. Then, a skeleton validation environment is automatically generated for the service. The skeleton validation environment includes testing automata produced from a traversal of the behavioral automata, a model of initial conditions, models of user requests, models of system response accuracy, an environmental model, and the dataflow and control flow assembling these models together. The skeleton validation environment covers all user requests and resultant system responses of the service. The skeleton validation environment is then recorded in a computer readable memory device for use by a design validation tool.

9 Claims, 16 Drawing Sheets

VALIDATION METHOD FOR EMBEDDED SYSTEMS

FIELD OF THE INVENTION

The present invention relates to the validation of system design and in particular to the design of a validation method for an embedded electrical system.

BACKGROUND TO THE INVENTION

Different tools and methods have been developed for systems design and testing. During the 1980's, structuring tools were developed allowing a system designer to specify the environment of his system and then, following a hierarchical approach, to specify the expected behavior of each part of the system. The structured analysis method is a good illustration of this first period.

However, for complex systems, it became quickly clear that this was not enough and design tools became executable tools allowing simulation. During this paradigm shift however, the link between early system requirements and system executable specification was not preserved at first. Of course, simulation under virtual constraints does not prevent testing in a practical environment and the traceability from early requirements to an executable model and then test cases was not built in. Coding was still made after simulation, allowing detection and correction of mistakes made at the early modeling steps.

Later it became clear that for very large developments, involving many persons, the link between early requirements and systems specification was of prime importance and requirements management systems started to establish the links between requirements, models, pieces of code and tests afterwards. At this step however, which represents the current state of the art, the link between requirements, models and tests is not formal and has to be maintained manually. Approaches like Universal Modeling Language (UML) make an attempt to capture the different process steps (requirements modeling and testing), but the UML formalism is too vague to support really more than an informal link between the different design steps.

In parallel, automated test generation strategies evolved to try to exploit information of executable models, but in the absence of requirements capture in the testing environment, testing is performed blindly with some hazardous approach and it is well known that such testing is very efficient on certain parts of a model but simply omits other parts.

In the case of manually generated tests, the state of the art consists in specifying test vectors that can be executed when the component under test has been set in a proper initial state, something which may be very difficult to reach for black box testing of a series electronic control unit (ECU).

It should be noted that for domains where the hardware design is very optimized, black box testing of series components is always necessary as the embedding of a real upper tester is too expensive.

Also, once a model is designed, a function may be distributed and then comes the challenge of providing unitary testing for each distributed piece of function; especially when the different pieces have to be developed by different suppliers. This is an open issue. At present, the favored approach is to wait for the different component prototypes, make the embodiment and then interact and debug. This means that real debugging starts when the hardware design is frozen, a hardly efficient process.

In case of a fault-tolerant function, it is also required to include fault injection in testing and combine this with the distributed character of such functions. At this stage again, no standard and determinist approach is available.

In U.S. Pat. No. 5,394,347, a method of designing a testing environment is disclosed which employs an EFSM (Extended Finite State Machine). There is no distinction between a user request and a system response in an EFSM and all user requests and system responses to those requests are always merged into transitions. In this proposal, system events are inputs but also cover outputs, such as for example a bell ringing. It is a disadvantage of U.S. Pat. No. 5,394,347 that the technology used does not distinguish between user requests and system responses, because it is then necessary to keep track of at least a "Variable Stack" and "Model Stack". Furthermore, this also means that in U.S. Pat. No. 5,394,347 it is only possible to validate the correct implementation of a specification and it is not possible to validate the specification itself. The simulations performed in accordance with the proposal in U.S. Pat. No. 5,394,347 are not performed in real time because time is considered as a variable of the environment of the system being tested that can be set with predefined functions referred to in the specification as "Force". This mechanism is not sufficient for the simulation of signal processing.

It can therefore be seen that there is a continuing need for improved methods for a uniform design of system testing which allows validating faithfully the system model and its physical representations at the different steps of its realization, especially in the case of distributed functions design.

SUMMARY OF THE INVENTION

It is an object of the present invention to provide an improved method for validation of system design and in particular to provide an improved method for the design of a validation method for an embedded electrical system. It will be appreciated that the electrical systems concerned include in particular electronic components and circuitry.

Accordingly, the present invention provides a method of designing a validation environment for a service implemented by an embedded electrical system, the method including:

a) assigning to said service one or more user requests and system responses thereto;

b) assigning to said service a behavioral automata, said behavioral automata fixing the allowed sequencing of said user requests and system responses;

c) generating automatically a skeleton validation environment for said service, in the form of a model executable on a simulation tool, said skeleton validation environment comprising a testing automata produced from a traversal of said behavioral automata, a model of initial conditions, models of user requests, models of system response accuracy, an environmental model and the dataflow and control flow assembling these models together, said skeleton validation environment covering all user requests and resultant system responses of said service, and d) recording said skeleton validation environment in a computer readable memory device for use by a design validation tool.

Using the skeleton, the testing environment can be simulated together with the model of the service under test to validate both the test environment and the model itself. By correcting very early mistakes in the design process, the method of the present invention allows time to be saved in the system design and development and improves testing coverage and so also quality. Said service may comprise a service used in a vehicle, such as for example a safety critical and/or fault tolerant system, e.g. brake-by-wire.

It will be appreciated that the output of the models of system response accuracy can be stored and analyzed to validate the function under test behavior. The output of a model of system response accuracy is typically a Boolean expression, which is set true when the response of the system is accurate and false otherwise.

It will be appreciated that the model of user request and system response accuracy can be predefined by storing at least a part of a skeleton validation environment previously developed.

The method may include assigning to each user request a function implementing it and assigning to each system response one or more functions implementing it, a dataflow of said skeleton validation environment being built using said functions of user request and system response.

The method may include assigning to said service a black box interface, whose input and output correspond to the input and output of at least one of the functions implementing the service, and interfacing the output of said service black box with said skeleton input and said skeleton output with the input of said service black box and completing and correcting skeleton and service specification in a simulation environment to yield a validation result.

The method may include outputting a validated model which comprises a validation environment for said service and at the same time comprises a validated model of the service.

The method may include substituting a model of the service with its software implementation.

The method may include substituting a model of the service with its software and hardware implementation and embedding said validation environment on a testing platform interfaced with said hardware implementation.

The method may include a systematic injection of faults for all replicated objects in a fault tolerant system, such as a brake-by-wire system in a vehicle.

The method may include assigning a validation environment for several services sharing at least one user request and mixing said validation environments of said service to yield a validation environment for the set of said services.

The present invention also provides a computer program comprising program code means for performing all of the steps of the present invention when said program is run on a computer. The present invention also provides a computer program product comprising program code means stored on a computer readable medium for performing the method of the present invention when said program product is run on a computer The present invention also provides a design tool adapted for the validation a system design, said design tool being arranged in use to output a validation environment for an embedded electrical system by using a method according to the present invention, or through being programmed using a computer program product according to the present invention.

When a section of software code has been generated from the model, parts of the model can be substituted with their corresponding implementations to validate the code generated. When the hardware of said system is prototyped, a piece of hardware in-the-loop environment can be implemented, embedding said testing environment. This is true even if the hardware environment is distributed over several electronic control units (ECU's).

When the wiring of the system is specified, the hardware-in-the-loop environment can be used to validate the wiring and connectors specification, especially in the case of safety critical systems where fault-injection can be used.

BRIEF DESCRIPTION OF THE DRAWINGS

The present invention will now be described by way of example only, with reference to the accompanying drawings, in which.

DETAILED DESCRIPTION OF A PREFERRED EMBODIMENT

An electronic system is made of Electronic Control Units (ECU), which may or may not be networked through communication busses, sensors, actuators, and electrical devices providing power to the different system components for example wiring, connectors, relays, fuses, battery and alternator.

An electronic system implements services to a customer, be the customer a worker in a plant, a car driver, a garage mechanic or an engineer. For instance, in the case where the electronic system under discussion is embedded in a car, the systems as discussed in our invention may implement services like climate, car motion, or door locking.

As an electronic system may implement many services, it may in those cases be refined as a set of subsystems, each subsystem achieving a specific set of services. In the description, we will not need to consider such decomposition and will simply consider a system and one or several services implemented by that system. Implicitly, considering a particular service, its associated system will consist in the components participating in that service implementation.

Validation of a system consists in proving, by means of simulation and testing, as exhaustively as possible, that the service requirements are properly covered by their implementation in a system. Validating a service can be performed at different stages of the design and by different approaches.

When the service is modeled, the model may be validated in a virtual environment. This is called "Model in-the-loop". Then, when the software implementing the service is produced, it can be accommodated in a model and validated. This is called "Software in-the-loop". Then when the hardware is designed, the environment can again be simulated in hardware environment which is interfaces to the system. This is called "Hardware in-the-loop Validation". The environment of the system is then called a "Hardware in-the-loop" environment or simply "HIL".

Figure 15:
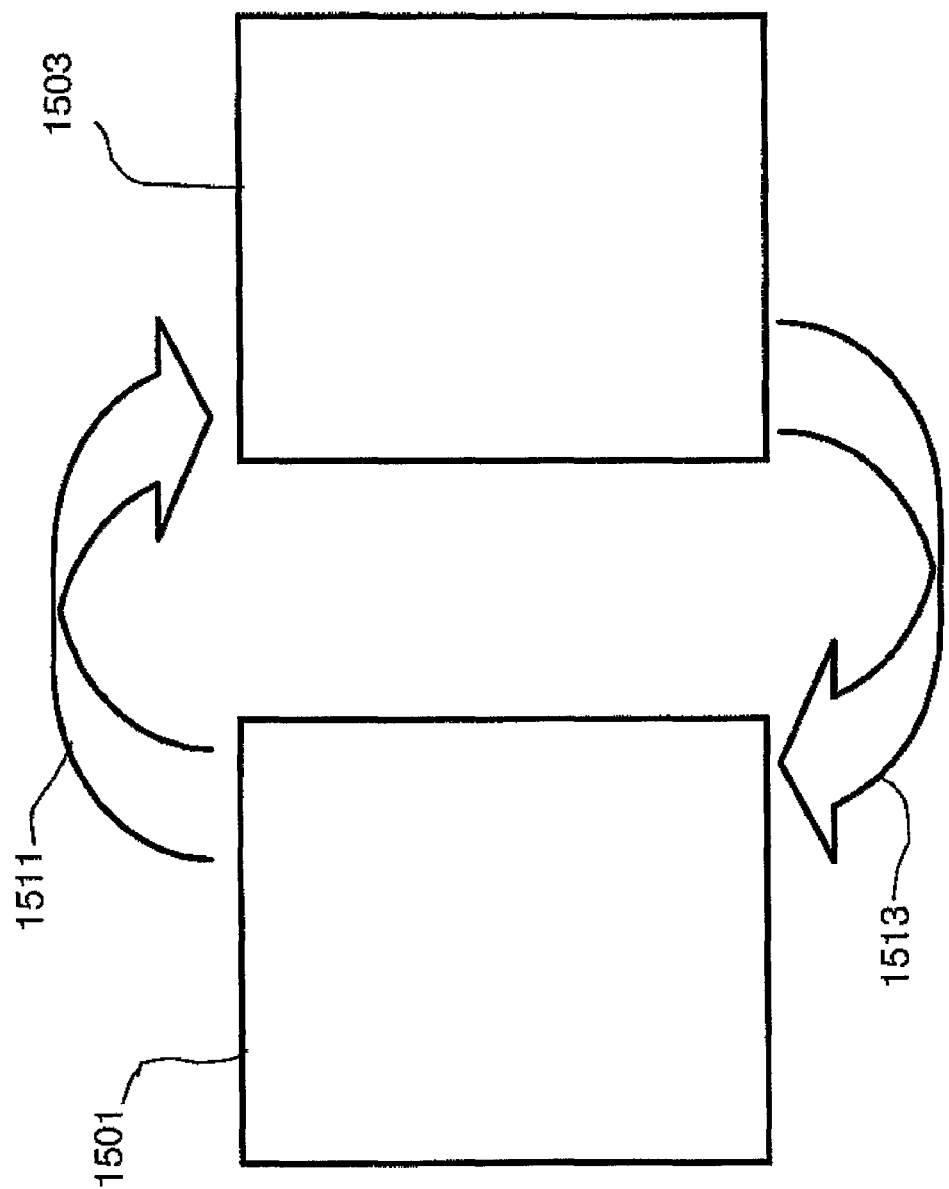
FIG. 15 illustrates the general paradigm of in-the-loop simulation and testing.

We have not mentioned yet the usual approach, which consists of producing test vectors. In fact, this method is inferior to the production of "in-the-loop" environment because producing a relevant test is difficult. The approaches of the present invention are very successful is because no method allowed, up to now, the design of in-the-loop testing models at a low cost. By producing testing environment skeleton, we allow this breakthrough at very low cost. In fact, when model in-the-loop is mentioned in the literature, the way interactive models of the environment are designed is never specified and is a duty of the designer of the system. The general idea is very simple as specified in FIG. 15. There is a model under test 1501, and an environment model 1503, and they exchange flows of information through flows 1511 and 1513. The simulation helps gain confidence in the model of the system. Practically, the design of such models is very difficult if we want to test something other than stationary simulations and in the absence of automatic generation as proposed in our invention. For instance, in order to test a braking system, many situations have to be taken into account. This is the purpose of our invention to help produce with a minimal effort such a testing environment, which can be applied afterwards to validate the model of the service, the software implementing the service and part or whole of the system.

The present invention provides a method of designing a validation environment for a service implemented by an embedded electrical system. To implement the method it is necessary to assigning to that service one or more "user requests" and "system responses" and both user requests and system responses are disclosed in FIG. 1 and its accompanying description.

Figure 3:
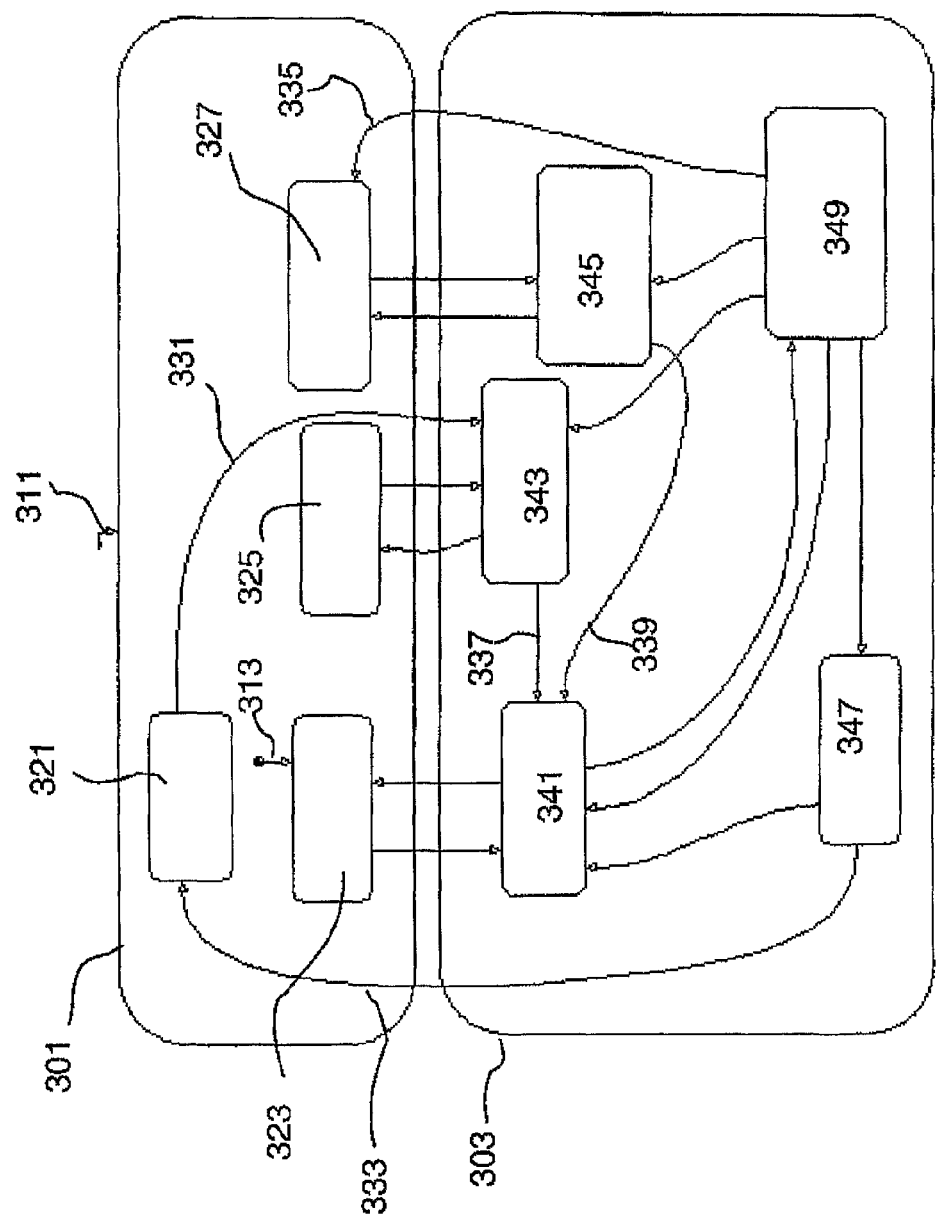
FIG. 3 illustrates the behavioral description of a service.

Next, it is necessary to assign to the service a behavioral automata, which fixes the allowed sequencing of the user requests and system responses. FIG. 3 illustrates the definition and content of the behavioral automata of a service.

Figure 4:
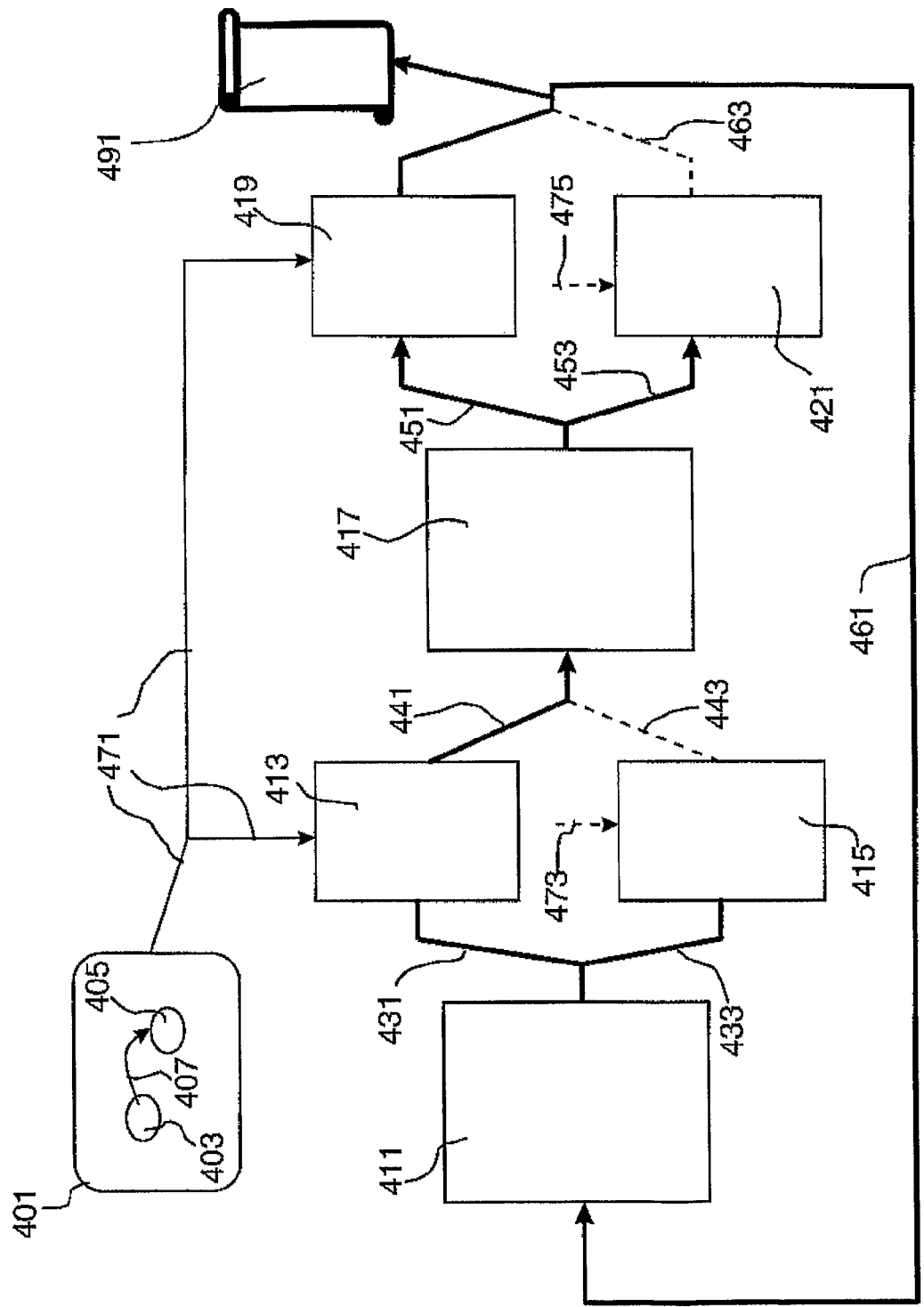
FIG. 4 illustrates a skeleton of a testing environment automatically generated through the present invention.

When this has been done, a skeleton validation environment is automatically generated for the service, which skeleton validation environment comprises a testing automata produced from a traversal of said behavioral automata, a model of initial conditions, models of user requests, models of system response accuracy, an environmental model and the dataflow and control flow assembling these models together. The skeleton validation environment covers all user requests and resultant system responses of the service. The Skeleton validation environment is illustrated in FIG. 4, in which is also presented a general framework of a testing environment. A particular instance of this framework is the skeleton automatically generated at this step.

The advantage of the process is that we save a lot of time to design a validation environment and moreover, our validation environment is covering exhaustively all the user requests and system responses of a service.

Further aspects of the present invention include assigning to each user request a function implementing it and also assigning to each system response one or more functions implementing it. A dataflow of this skeleton validation environment may be built using these functions of user request and system response, as described in relation to FIG. 2. How the dataflow of the function and the dataflow description of a service is turned into a dataflow for the skeleton validation environment is illustrated in FIG. 4.

Further aspects of the present invention include:

g) including assigning to the service a black box interface, whose input and output correspond to the input and output of at least one of the functions implementing the service;

h) interfacing the output of that service black box with the skeleton input and the skeleton output with the input of the service black box; and i) completing and correcting the skeleton and service specification in a simulation environment to yield a validation result.

The black-box interface of a service is illustrated by block 417 in FIG. 4, which details the interfacing of all the blocks of the validation environment.

The method of the present invention also includes outputting a validated model which comprises a validation environment for the service and at the same time comprises a validated model of the service. The way this simulation works is described in FIG. 4 when a simulation in-the-loop process is detailed.

Figure 11:
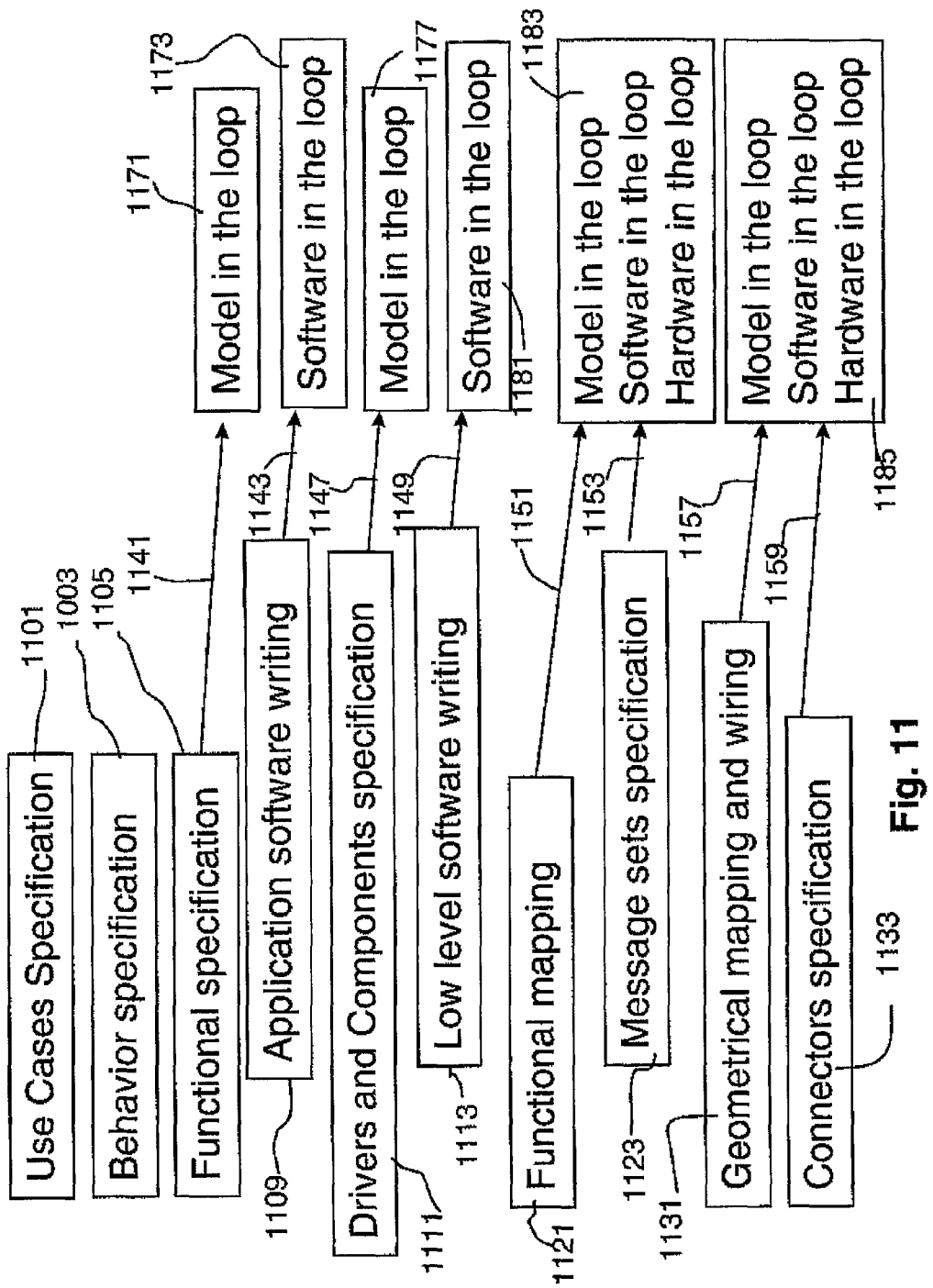
FIG. 11 illustrates an embodiment of a design process according to the present invention.

Under another aspect of the present invention, a model of the service is substituted with its software implementation, which is described in relation to FIG. 11 where the different steps of validation of the software implementing a service are described.

The method of the present invention also includes substituting a model of the service with its software and hardware implementation and embedding that validation environment on a testing platform interfaced with a hardware implementation. The way the hardware implementation is inserted into the validation environment is illustrated with respect to FIG. 7 for the ECU and network aspects, and in FIG. 8 to integrate the wiring in the validation. The messaging descriptions for a network are specified in FIG. 14 and the apparatus to implement a hardware validation for one or several ECU's is described in relation to FIG. 13.

Figure 16:
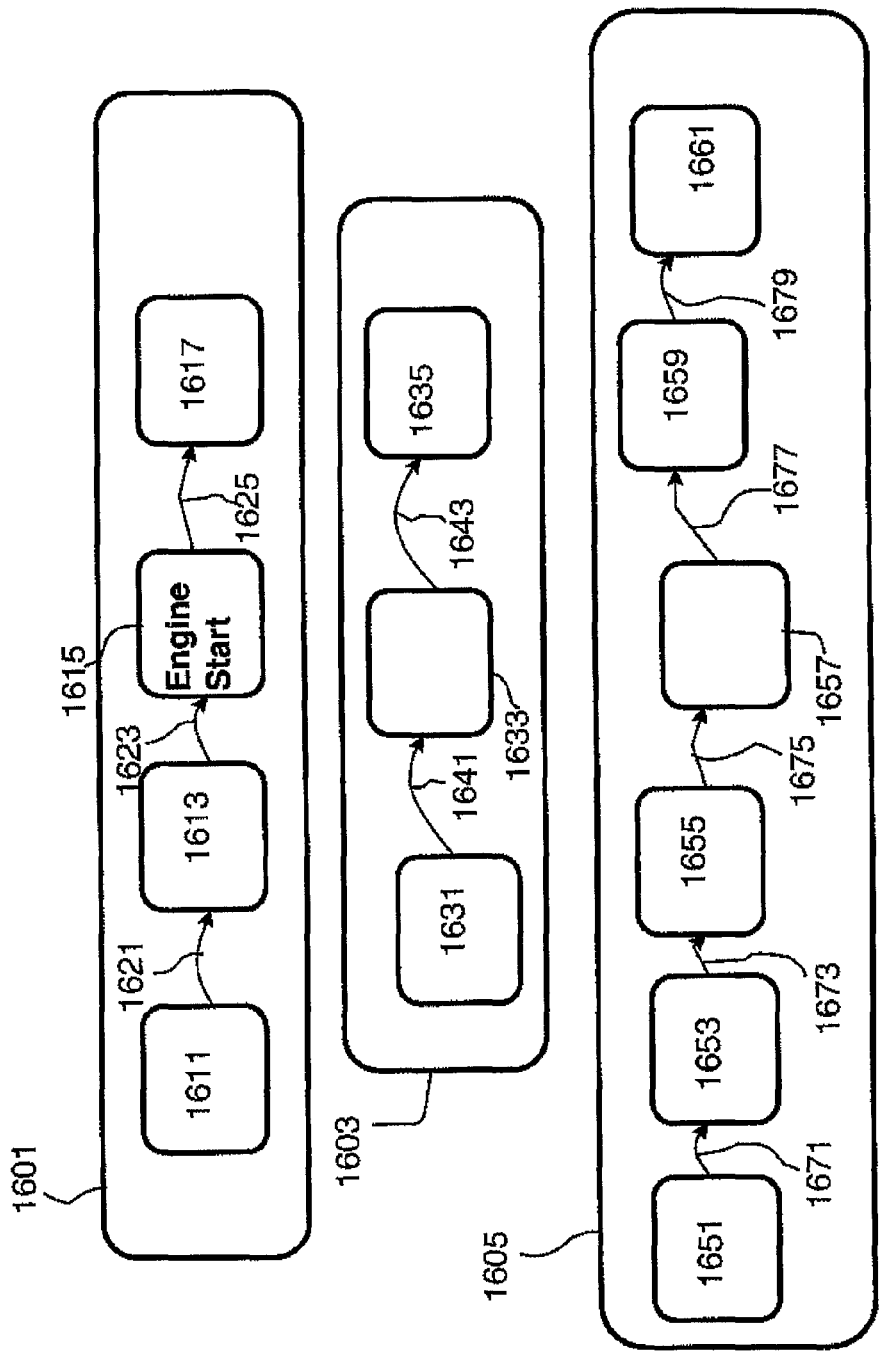
FIG. 16 illustrates mixing the testing environments of several coupled services.

The method also includes a systematic injection of faults for all replicated objects in a fault tolerant system, such as a brake-by-wire system in a vehicle. The process followed to define a fault tolerant system is recalled in FIG. 12 and its accompanying description. Then fault modeling and injection is illustrated with respect to FIGS. 9 and 10. Under another embodiment, our invention allows mixing validation environment for services that share at least one user request. This is illustrated in FIG. 16.

Figure 1:
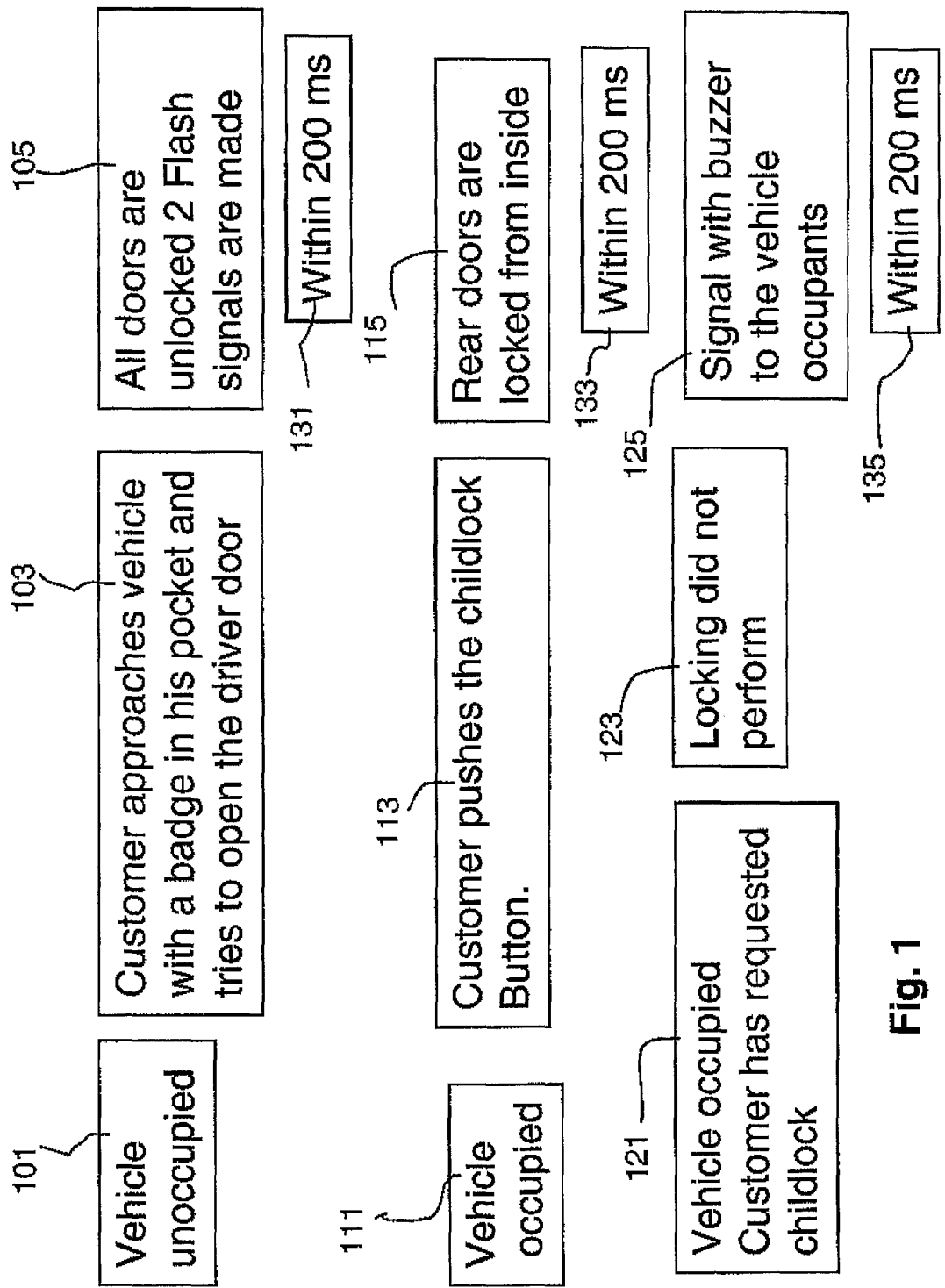
FIG. 1 illustrates the specification of Use Cases of a service.

In FIG. 1, a non-limiting example of three Use Cases is presented. These exemplary Use Cases address a non-limiting service in the form of the description of the locking management of vehicle doors. For each Use Case, a description in four parts is provided. First parts 101, 111, 121 are contexts in which the respective Use Case may apply. Second parts 103, 113, 123, are user requests, which characterize respective Use Cases. Third part 105, 115 and 125 are system responses triggered by user requests. Fourth part, 131, 133 and 135 are the latency between the user request and the system response. They are not mandatory at the initial stage.

User requests may be implicit in whatever field the test is being applied. For instance in an automotive field, when a car crash occurs we consider the crash to be a user request. That is because certain functions are triggered automatically on behalf of the users even if not specifically requested at their initiative. Examples might be "fuel cut-off" or "air-bag-trigger". We will consider the user is responsible for all external conditions around the embedded system. Said another way, "user. request" may be taken in a broad sense as "user requests and demanding situations created by or affecting the user".

The context is somewhat loose because many different initial conditions may be tolerated for a Use Case. For instance, a context for a door locking service may be that all the doors are unlocked and that the engine is running.

Considering that system responses are states and that user requests are transitions, a set of Use Cases can be turned into a Moore automata. The exact process consists in associating to a Use Case a set of transitions, from initial states fitting with the context of that Use Case to one ending state corresponding to the system response of that Use Case. It is then necessary to specify an initial state of the system to obtain a behavioral description of a service. However, our invention supports different specification processes as long as the behavior could be specified as Moore automata and under other constraints described in the next figures.

Figure 2:
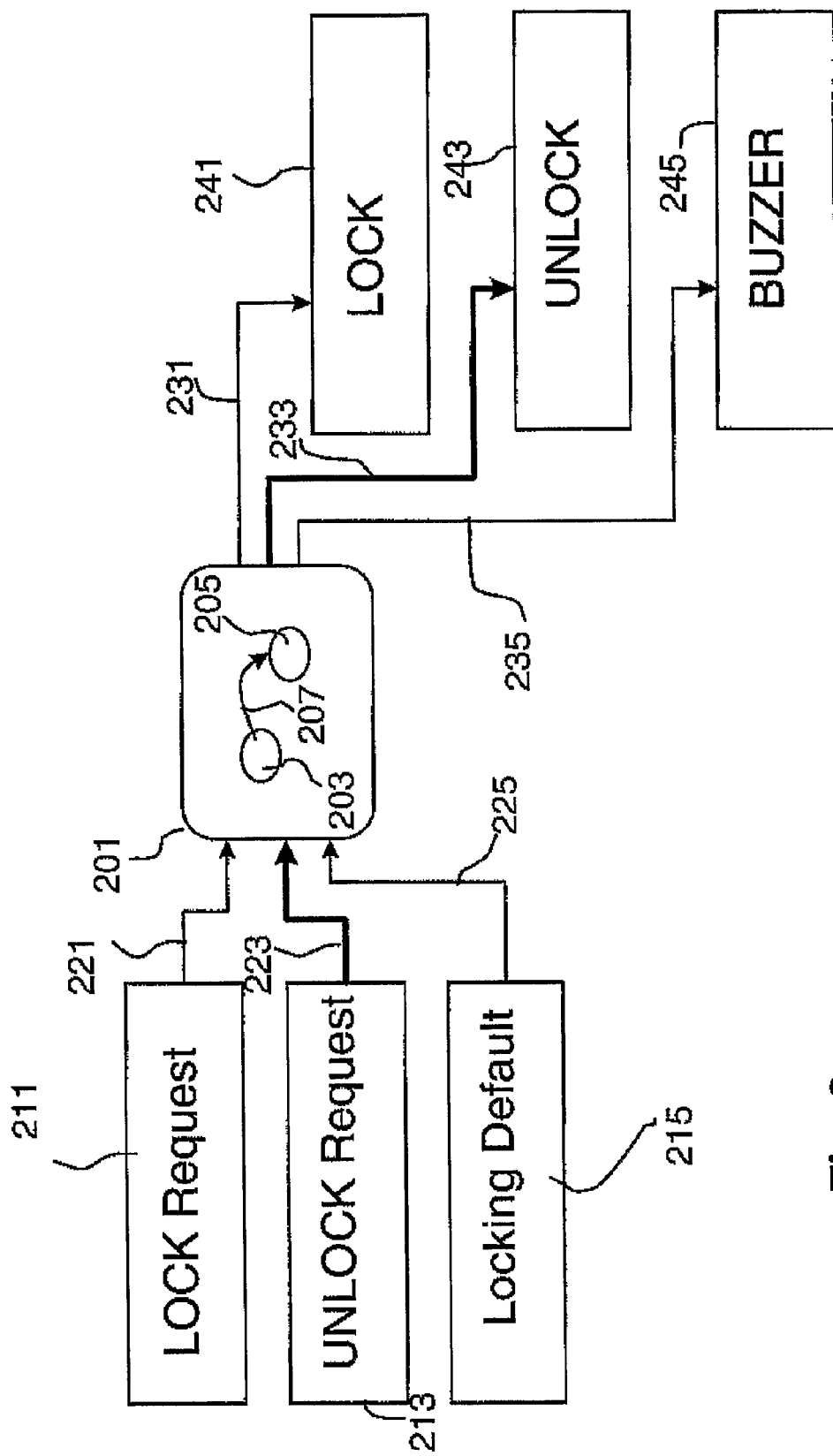
FIG. 2 illustrates the functional description of a service.

In FIG. 2, the functional architecture of a service is described. The user requests are implemented by functions 211, 213 and 215 and the system responses to be performed in states are implemented by a set of functions among 241, 243 and 245. These functions may have interactions between them or even precedence or scheduling constraints once modeled. The semantics of functions is not specified in the figure, a function may be an arithmetic operation over its input or some filtering or a mix of both. The automata 201 may receive stimuli 221, 223 and 225 from the environment and, depending on its current state, it changes state or not. For instance, being in a state where the vehicle is locked, if the unlock request, 213, sends a value "true" through dataflow 223, the automata may run to a state in which function "unlock" is activated through trigger 233, having as a consequence the unlocking of vehicle doors. Depending on the actual state of 201, Functions 241, 243 and 245 might be triggered by control flow 231, 233 and 235, each of these control being scheduled when entering into a state. Such behavior can be faithfully implemented by simulation tools like Mathworks's "Matlab/Simulink", or I'logix "Statemate", which allows a simulation in advance phase as soon as an environment is build for the simulation.

In FIG. 3, a sample of Moore automata is presented. States 321, 323, 325, 327, 341, 343, 345, 347 and 349 are linked each to other through transitions 331, 333, 335, 337, 339 among others. Let us explain this automata semantics by means of example. For instance, continuing the door locking service example, assume that in state 343 the vehicle is locked and that in state 341 the vehicle is unlocked. Then assume that, during transition 337, an unlocking request is triggered. Following the scheme outlined in FIG. 2, the transition 337 may be trigged by stimuli 223, and resulting state 341 may trigger function 243. As for the link with Use Cases, state 341 may result as the response state 105 and transition 337 could correspond to user request 103. Then, the state 343 would have to match the initial condition 101.

Outlines 301 and 303 represent phases. A phase gathers together a set of states which have common contextual information. For instance, "engine running" may be a phase for cooling because cooling can only be performed when the engine is running. Whatever the number of different cooling states could be defined, they can all be gathered in the "engine running" phase. Phases are useful to simplify the readability of Moore automata but will not be specifically used in the present embodiment.

Initial phase and states are specified by triggers 311 and 313 in the manner of Statecharts. This means that 323 is the initial state of the service at the very beginning of its first operation. Also, for each transition, a delay may be specified under which the transition cannot be activated. For instance, assume state 349 consists in locking the rear doors of the vehicle from inside so that children could not perform a predetermined operation, e.g. open the rear doors from inside—"child lock". For safety reasons, verification that the doors are actually locked may be performed through a monitoring of lock positions. Suppose that state 347 consists in signaling that the doors eventually did not lock, and that transition 351 is triggered when locking did not perform as a consequence of lock position monitoring. Then if 351 is operated before the doors have physically had the time to be locked, due to relays or actuators latency, the transition 351 could be activated improperly and turn the system to state 347 inconsistently. So once the system enters state 349, transition 351 should not operate before the worst case execution latency of the components involved in locking the rear doors. Such latencies can be specified directly on the transitions using formalisms like Matlab/Simulink.

The structure of a testing environment, or validation environment, according to an embodiment of the present invention is described in FIG. 4, in which outline 417 represents the system under test. As this will be explained further later, the system under test may have the form of a model, of software or of an electrical system. Outline 401 represents the testing scenario that is going to be applied. The testing scenario of our invention is exhaustive in the sense it will cover all the states and transitions of the behavioral model as described in FIG. 3.

In order to test a service, we simulate the environment of the service to enforce a path in the behavioral automata of the service and, depending on the current state, we perform checks to verify that the intended service state is the actual service state.

To reach this objective, each user request is associated with a testing request. It is a one-to-one correspondence, except that one of the testing requests sets up the initial conditions for execution, we will call this special testing request the initial conditions block. The purpose of a testing request is to change the input of the service under test so as to stimulate its associated user request. For instance, if a user request is "stop the engine", its corresponding testing request may consist in setting input value "engine status" at a value "engine stopped". Similarly, state checking functions are associated with each state, the objective of a state checking function is to check whether the associated state has been processed or not.

Outlines 413 and 415 represent testing requests, each one of which is associated with a user request. In a complete drawing, we would find as many testing requests as user requests, plus an initial conditions setting outline. Outlines 419 and 421 represent state checking functions.

Outline 411 represents the environment loop. For instance, if a sensor oi the service under test is capturing the position of an actuator controlled by the service under test, then the relationship between such an actuator and its associated sensor will be implemented in the environment loop. A data flow may come back from a testing request into the environment loop, especially in case we want to observe states corresponding to failures of an actuator. In that case, the testing request sends information to the environment loop to ask for a failure in the actuator modeling. This is convenient as long as the actuator and the sensor are simulated. For real components, the failure may be obtained by some special system controlled by the corresponding testing request. When the testing environment is running, checking results are recorded in 491 which may consist of a record of each signal or of a simple acknowledge by each state checking function.

Outline 401 represents the automata, which triggers both the testing transitions and the state checking requests. This automata selects which testing request is visible from the 417 at any moment, be the moment in simulated time or real time. In parallel, the testing automata selects the state checking function that will receive the output of the service under test at any moment.

Control flow 471 allows triggering which of the testing request and state checking functions are visible from the service under test at a given moment. This does not prevent other testing requests from running, but their output is simply ignored.

Flow 431 represents the set of input and output dataflow of the service under test, when the selected testing request is 413. Flow 433 is of the same type, but when testing request 415 is selected.

Flow 441 represents the input of the service under test. This is consistent with the consumption of 441 by the service under test 417.

Flow 451 represents the output of the service under test. This is consistent with the production of 451 by 417.

Flow 461 represents again the flow of the service under test. This flow may be used only for the purpose of checking in the state checking function 419 and may not be changed. However, additional flow may be produced to record a trace of the checks and may be consumed only by 491.

The initial conditions block has no input and its output flow contains both input and output initial values for the service under test. These initial values are consumed by the environment loop 411 at the beginning of the validation.

To understand the dynamic behavior of the testing environment, we describe how the different blocks and flows in FIG. 4 are working and give some example of how information is exchanged through the different flows and modified by the different blocks.

For instance, let's consider that testing request 413 and state checking function 419 are currently triggered in FIG. 4. Then a loop is running between blocks 413, 417, 419 and 411. This loop is possible due to dataflow 441, 451, 461, 411. Starting from the service under test, suppose that service 417 is a door locking service and that it has just turned to a locking state, starting from an unlocked state. Then locking command is sent through 451, then the state checking process 419 receives the locking command and sends an acknowledgment to the test results record 491. But block 419 does not modify the output flow 451 and forward it through 461 to environment loop 411. In the environment loop 411, the locking command is received in a model of a locking actuator which, after a certain delay, sets the door status to "lock". Then, environment loop 411 sends the information (that the door is locked) through 431, to the testing request 413. This information is received as if it was emitted by the lock status sensor. The testing request 413, which aims at triggering a door locking when the vehicle is unlocked simply forwards the locked status of the door to the service under test 417, through dataflow 441. Then the service under test does not change of state as no new request is coming from its environment, and the loop continues without any change.

If we were to loop with a control system, things would not change except some regulation loop would be running all the time, even when no change is requested by the testing automata.

To illustrate how the testing automata can be preferably implemented, we describe now how the test scenario described above could go on, starting from a locked vehicle.

Assume that the state checking function 419 was triggered by state 403 in the testing automata, corresponding to the current locked status of the vehicle. Then assume that transition 407 triggers testing request 415 corresponding to an unlocking request. Once 415 is triggered, flow 441 becomes inactive and flows 433 and 443 become active so that the service under test now receives its input from 415. After the transition 407 has been processed, the testing automata enters state 405 in which the state checking function 421 is triggered. Then, the flows 453 and 463 become active and 419 output is ignored, so that the service under test output is now sent exclusively to 421.

The new loop is now 415, 417, 421, 411 and then again 415. Testing Request is going to change the environment so as to stimulate an unlocking request at 417 input. As a reaction, block 417 will send an unlocking request to state checking function 421 which will send an acknowledgment to test result record 491 (if everything is working properly). Block 421, does not modify the 417 output and forwards the dataflow directly to environment loop 411 through flow 461. As a result of the unlocking command, the door status, which was previously locked, will turn to unlock. This new state is then forwarded as sensor information to the testing request 415 through flow 433. Once the door is unlocked, testing request 415 may become idle so that no other request is stimulated through flow-443 and the loop becomes stable until a switch to another testing request.

At the initial step of the validation, the initial conditions block is activated and injects a first set of inputs to the service under test 417. This primes the validation. For the validation to be performed with a good chance of success, the initial conditions may be easy to establish and a sufficiently stable initial state, for instance a state where the service is set off.

We have explained the semantics of the different objects specified, and gave examples of how the system dynamically performs. However, for the sake of completeness, it is necessary to explain how time is dealt with. In fact, each transition of the testing automata is specified with time latency. Similarly, each transition of the behavioral automata of the service under test is defined with time latency as specified in the explanation accompanying FIG. 3. Latencies in the testing automata are specified before each transition to a new testing request. If the testing request is to monitor a transient state of the service under test, then the latency may be very short, in relation with the reactivity of the service under test.

FIG. 4 is a general framework for our testing environment and it may be modified and customized in many ways, depending on how the different outlines are implemented. This will be detailed in the comments relating to FIG. 11.

At the simulation level, the environment can be implemented by models developed with a tool like Matlab/Simulink. This allows detecting bugs at the modeling level. In order to perform such a simulation, a global time definition can be specified and a specific latency can be attached to each transition in the testing automata, in the environment loop, and in the model of the service under test.

Some variants are possible on this scheme: first, it is possible to associate several testing requests to a user request, or to share common functions between different testing requests, or to parameterize the testing requests, or introduce random variables inside the testing request specification. These are variants of how the testing request will be eventually implemented, but all these variants are equivalent to the framework described in FIG. 4, except that some parameters related to the simulation may be uniformly added to the testing automata, the testing requests and the state checking functions.

An instance of a testing environment, or validation environment, as described in FIG. 4 can be automatically generated once a service is specified in block 417. This very first instance is called the skeleton validation environment. In that skeleton, all the blocks 411, 413, 415, 417, 419 and the like are generated automatically. The dataflow between the blocks are generated automatically accordingly with the description of FIG. 4. The dataflow inside these blocks are also generated automatically, the blocks behave like identity when an input is also an output. Other inputs terminate in the block.

Such an automatic generation is possible for instance in a simulation environment like Matlab/Simulink.

Figure 5:
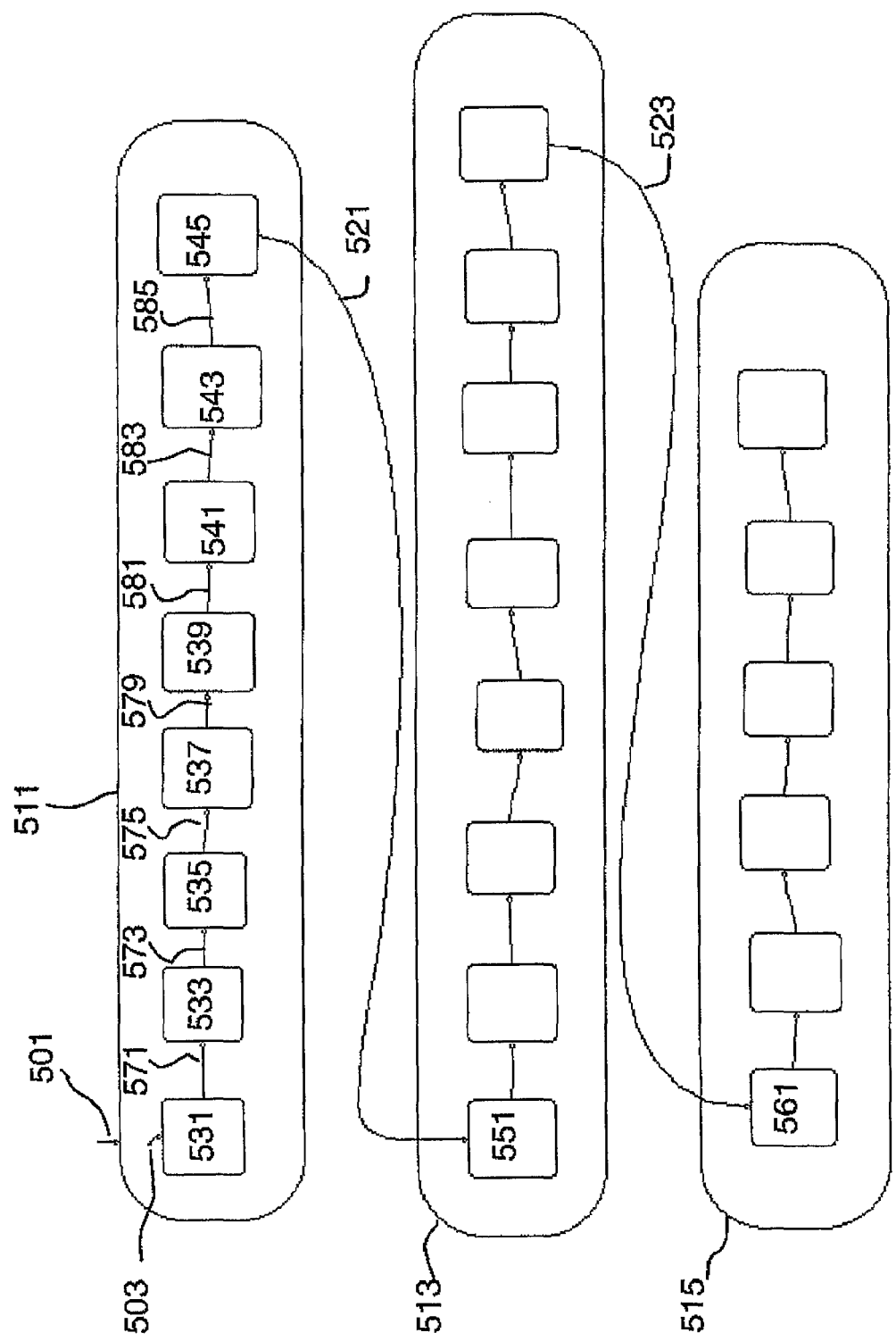
FIG. 5 illustrates the testing automata which is part of the testing environment in FIG. 4.

In FIG. 5, a testing automata is represented. Each state of the testing automata corresponds to a target state of the behavioral model under test and each transition of the testing automata corresponds to a testing request. It should be remembered that, except for the initial conditions block, each testing request corresponds to a user request.

The purpose of testing, as described in our invention, is to provide sequences of test that will allow a complete coverage of the states and transitions of the behavioral automata of service under test.

Each transition of the testing automata corresponds to the stimulation of a transition in the behavioral model we want to test. So there is a one to one correspondence between testing states and states of the behavior. For instance, for a state called "lock the vehicle doors", the testing state will have the semantics "we are testing the case where the system must perform locking of vehicle doors". Similarly given a request "unlock vehicle" in the behavioral model under test, the corresponding request in the test plan will have the semantics "the environment is modified so that the unlock vehicle is requested by the user". All of this is clear from the description of FIG. 4.

Due to the one-to-one correspondence between testing request (except for the initial conditions block) and user requests in the service under test, a test can be considered as a sequence of user requests that we want to emulate from the testing environment. So the purpose of building the test model is to provide an exhaustive coverage of user requests and states in the service under test, and this can be reached by identifying a list of sequences of user requests that will reach all the states and pass though all the transitions of the service under test.

We present now a preferable implementation of test generation under the form of an algorithm in graph theory. The algorithm used looks like an in depth first search in the automata seen as an oriented graph. In graph theory, states are called nodes and transitions are called arrows. Note that several arrows may link two states because we did not forbid different transitions to have the same source and target states.

The idea is to build function predecessor, called "p" that will be associate itself to each node in the graph and to each arrow with that node as target, a predecessor such that that arrow is going from that predecessor to that node. The predecessor requires also an initial state to be specified. Once that predecessor function has been automatically identified, in depth test scenarios are build recursively from p.

First, we turn to the definition of the predecessor function on an oriented graph.

In the course of the algorithm operation, each node may have status S1, which means that it has been processed by the algorithm during former operations or S2 which means the converse. Given a node with status S2, it may have status E1, which means all immediate successors of that node "N" in the graph have been visited starting from "N", or E2, which means the converse. The successors of a node "N" are the nodes that are the target of an arrow with source "N". For each node "N", the number of successors of "N" is named d(N). If we call n(N) the number of successors of "N" already visited from "N", then "N" has status E2 as long as n(N) is strictly inferior to d(N). If n(N) is equal to d(N) then, "N" has status E1. Note that the successor of a node "N" might be at the same time S2 and E1, in the case it has been processed by the algorithm in a former step, but not yet visited starting from "N".

The Algorithm is Recursive:

Initially, a node "$N_0$" is selected as the initial node for the algorithm. This corresponds to the initial state in the test plan.

At a given step of the algorithm, a node "$N_k$" is being processed (like "$N_0$" at the initial step!). Two cases are possible:

if "$N_k$" status is E2, then at least one successor of "$N_k$" is not visited, starting from "$N_k$", let's call it "$N_w$".

if "$N_w$" has status S2, then set p("$N_w$")="$N_k$" for each transition from "$N_k$" to "$N_w$", and the algorithm processes "$N_w$".

if "$N_w$" has status S1, come back to node "$N_k$", "$N_w$" being now visited if "$N_k$" status is E1, which means all the successors of "$N_k$" are now processed, then if there exist a predecessor "$N_y$" for "$N_k$", the algorithm is applied recursively to "$N_y$".

The algorithm stops when "$N_0$" has status E1.

Now that p is build up, we turn to the scenarios construction. If a node is not the predecessor of another, we call it a leaf. The scenarios are simply the list of all possible sequences of states and transitions starting at node "$N_0$" and ending at all possible leaves. Each scenario is build starting from a leaf and then applying the predecessor function till backtracking to "$N_0$". In the case where at most one oriented transition links two states, this definition is sufficient. But furthermore, we have the expectation that all possible transitions between two nodes are visited by at least one scenario. This extension is quite simple to implement and we do not detail an algorithm.

The previous step yields a list of scenarios, each scenario starting from state "$N_0$" and ending in another state "$N_i$". If possible, we then compute, for each such scenario, a return path from "$N_i$" to "$N_0$" and append it to that scenario, using a classical algorithm to link two nodes in an oriented graph (the path needs not to be a shortest one in terms of number of transitions). We then obtain a list of test scenarios, each one starting at "$N_0$" and ending at "$N_0$". Some scenarios may not return to "$N_0$" which means they correspond to some "non return" change. This is very unlikely in an embedded system except for very special cases such as vehicle crash where the system is not intended to continue operations.

So, at the end of the test scenarios identification we get a list of scenario, each scenario being composed of a sequence of successive states and transitions, each scenario starting at initial state "$N_0$" and ending at "$N_0$", when possible. Moreover, these scenarios form a complete coverage of all the states and all the transitions of the behavioral automata of the service. Other implementations are possible for testing automata generation. We refer to [AHO74] for other possible implementations.

Returning to FIG. 5, outlines 511, 513 and 515 represent test scenarios as specified in the description above. Outlines 531, 533, 535, 537, 539, 541, 543, 545 (531 to 545) represent states that correspond to a target state of service under test and transitions 571 to 585 correspond to target transition activation of service under test.

Initial conditions, corresponding to a start at state 531, must be set up in conjunction with the selected initial state 531. The initial state is identified from initial start symbols 501 and 503. For each signal, proper initial value must be set up. For instance, if the initial state for a Door locking service is that the vehicle is idle and all doors are locked, the door locking status and the engine status must be set accordingly. All tests are starting and ending in the same system state (whenever possible, some states may be unreachable). So transitions 521 and 523 are empty transitions between two scenarios. The fact to come back to a reference state at the end of each scenario allows executing successive scenarios without stopping the simulation which corresponds to a "continuous testing". This means that in the example of FIG. 5, states 531, 545, 551 and 561 correspond to the same state of the service under test. Of course if some state is reach without possibility to return to a reference state, the simulation must be stopped and then restart with initial conditions in another scenario.

As mentioned in FIG. 4, timings are specified on transitions of the test automata, either to let the tested function having time to react properly, or to test timely transient transitions. The timing may vary in specified ranges and testing can then be coupled with a hazard latency generation, under the ranges specified for each transition. It is also possible to add triggers on a test transition. Such triggers correspond to the completion of a user request or system response constraint. For instance, if the user request is "reach a speed of 100 km/h", then a signal indicating that the speed of 100 km/h is reached can be a trigger to traverse a new user request. In the test automata, transitions could be a mix of delays and triggers, e.g wait one second after a trigger before operating a new user request The scenarios described in FIG. 5 test only that the system is reacting properly when this is due, e.g. each time a user request may change the state of the system. However, it is sometimes required that some user request had no corresponding system response under a given Context. This is a kind of "not happen" Use case or impossible Use Case.

The testing plan can be completed so as to include testing of impossible Use Cases, these Use Cases corresponding to user request with no answer in a certain state. To implement this, we simply stuff the test scenarios, with supplementary states and transitions corresponding to user requests that will be ignored. Such ignored user requests do not change the resulting state. For instance if transition 579 implements an ignored user request corresponding to an impossible use case, then states 537 and 539 will correspond to the same state off the service under test. Note that, if the behavior is simplified, if transitions some transitions are canceled, the test scenarios generated will still be valid but partial.

Figure 6:
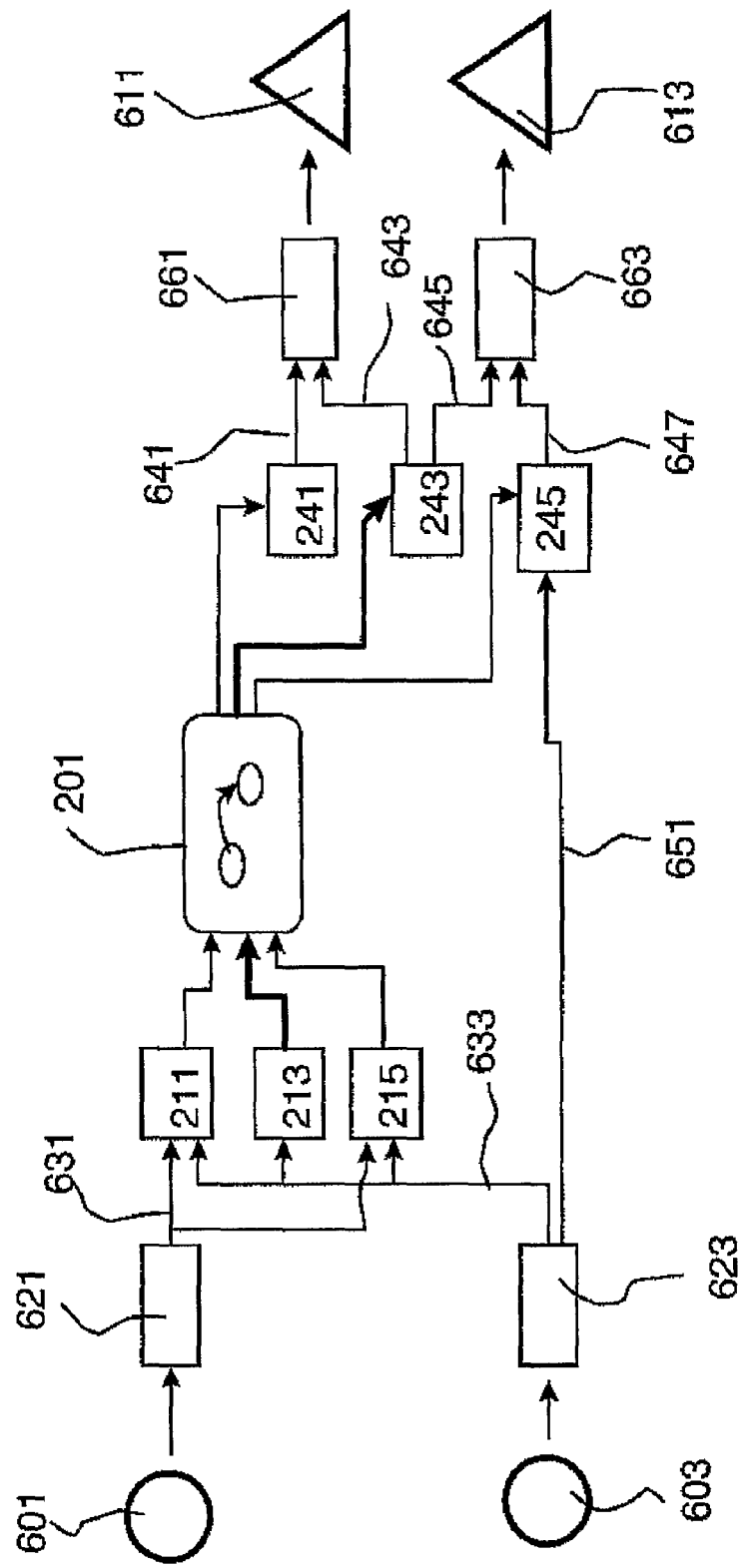
FIG. 6 illustrates the functional description of a service.

In FIG. 6, we describe the layout of a service under test at the functional level. The behavioral automata 201 and functions 211, 213, 215, 241, 243 and 245 are taken from FIG. 2 together with the respective flow linking these blocks in FIG. 2. In FIG. 6, we discuss in particular input and output drivers.

Driver 621 captures information from sensor 601 and dispatches this information to functions 211 and 215. Note that 211 and 215 may consume the flow at different rates. Driver 621 may be for instance a logical input which would receive from sensor 601 a high or low signal and transmit accordingly value "0" or "1" to functions 211 and 215 at a given sampling rate. Similarly, driver 623 captures information from sensor 603 and dispatches this information to functions 211, 213 and 215, but also 245. The link between 623 and 245 illustrates the fact that captured information may be directly consumed by functions implementing system response of the service under test, e.g. for a control loop.

Driver 661 commands actuator 611 and receives information from functions 241 and 243 through respective flows 641 and 643. This means that functions 241 and 243 may command actuator 611 at different states of the service under test, or again that functions 241 and 243 both participate in the command of actuator 611 each time this actuator is commanded. Similarly, Driver 663 commands actuator 611 and receives information from functions 241 and 243 through flows 645 and 647. This modeling of a service under test can be inserted in block 417 of FIG. 4 in different ways.

A solution is to insert only functions and not drivers in block 417. In that case, the input and output of 417 are logical or "digital" input and output, and the validation does not include the low level software and hardware of the service under test. Only the behavioral automata and the functions are validated. Another step consists in including the drivers 621, 623, 661 and 663. In that case the validation is performed at the physical level. In that case, the drivers are also validated.

If the content of the 417 block is a service as describe in FIG. 6, this is essentially for the purpose of validating the specification and the software, because neither Electronic control units nor communication networks are specified. This is the purpose of FIG. 7 to detail how Electronic control units and networks are validated. However, in the case where the service under test is mapped on a unique ECU (Electronic Control Unit), for instance in the context of a rapid prototyping implementation, then, the service as describe in FIG. 6 can be he basis for a hardware in-the-loop testing.

Figure 7:
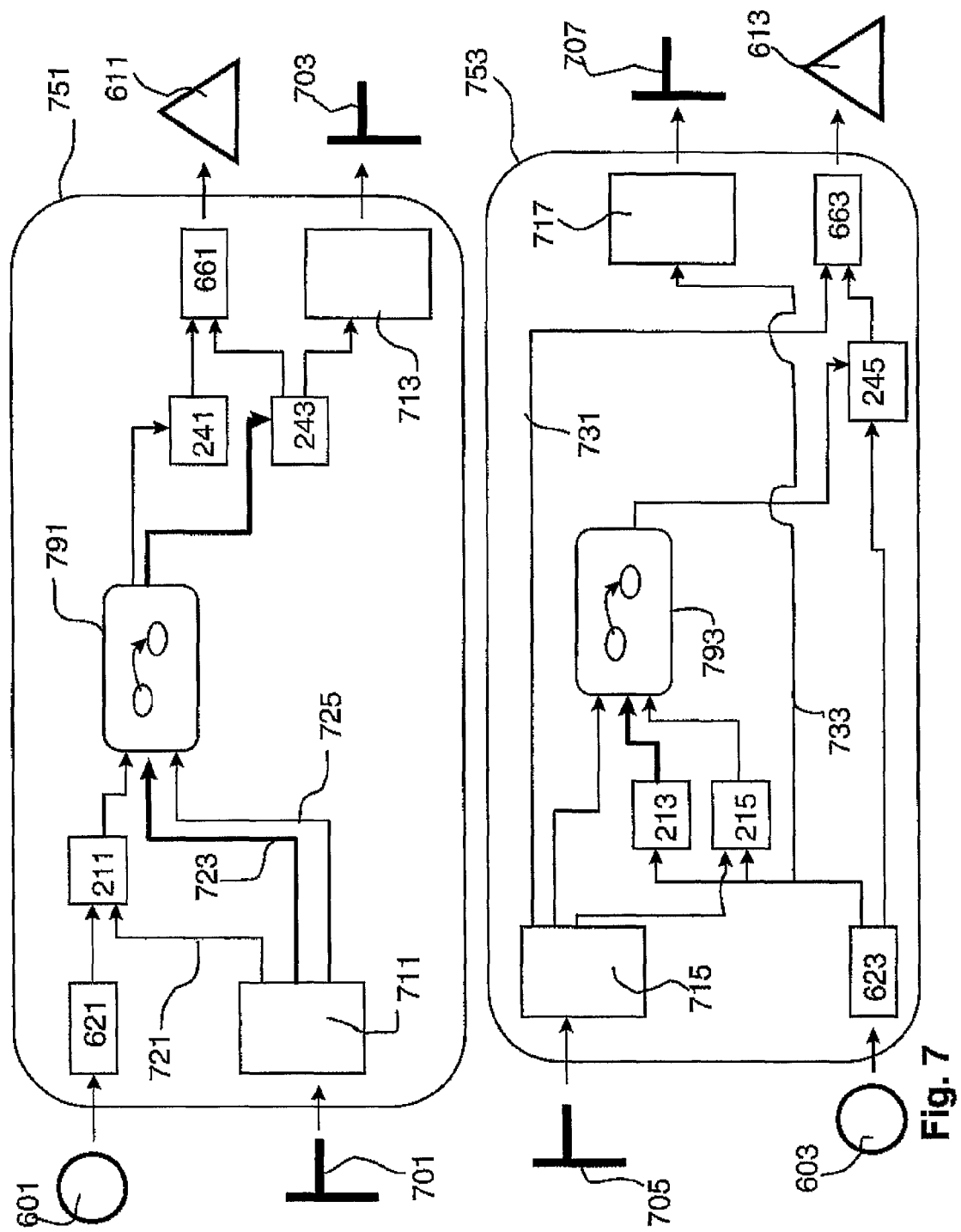
FIG. 7 illustrates a distributed system including two ECU's and a network.

In FIG. 7, the service described in FIG. 6 has been mapped on a physical architecture composed of ECU and communication networks. Symbols 701, 703, 705 and 707 denote a unique communication network that we will call network 701. This network may be for instance a CAN bus. Outlines 751 and 753 denote electronic control units. In fact 701 corresponds to the network input flow in 751, 703 to the network output flow from 751, 705 to the network input flow in 753 and 707 to the network output flow from 753.

The physical interface of ECU 751 is composed of sensor 601, actuator 611, and of the network interface. Similarly external interface of ECU 753 is composed of the sensor 603, actuator 613 and of the network interface. If we look carefully at the blocks inside the ECU 751 and 753, we can see that the service described in FIG. 6 has been distributed. The behavioral automata is distributed inside outlines 791 and 793 and we will assume that, the distribution strategy preserves the input and output the original behavioral automata in FIG. 6 or 2. However, other distribution strategies are supported. Also the drivers have been distributed in function of the mapping of their associated sensor or actuator.

Functions 211, 241 and 243 have been mapped on ECU 751 and functions 213, 215 and 245 have been mapped on ECU 753. Due to the mapping, we can see that the flow produced by driver 623 in ECU 753 is consumed by function 211 in ECU 751 and this is possible due to the network connection between ECU 751 and 753, through drivers 717 and 711. So data flow 633 in FIG. 6 is now implemented as the composition of dataflow 733, emitted on the network from 753 through network driver 717, received from the network in ECU 751 through network driver 711 and propagated to 211 through flow 721. If now the service under test in FIG. 4, in outline 417, is implemented as in FIG. 7, then we can for instance validate that the messaging on the network is implemented properly.

Figure 8:
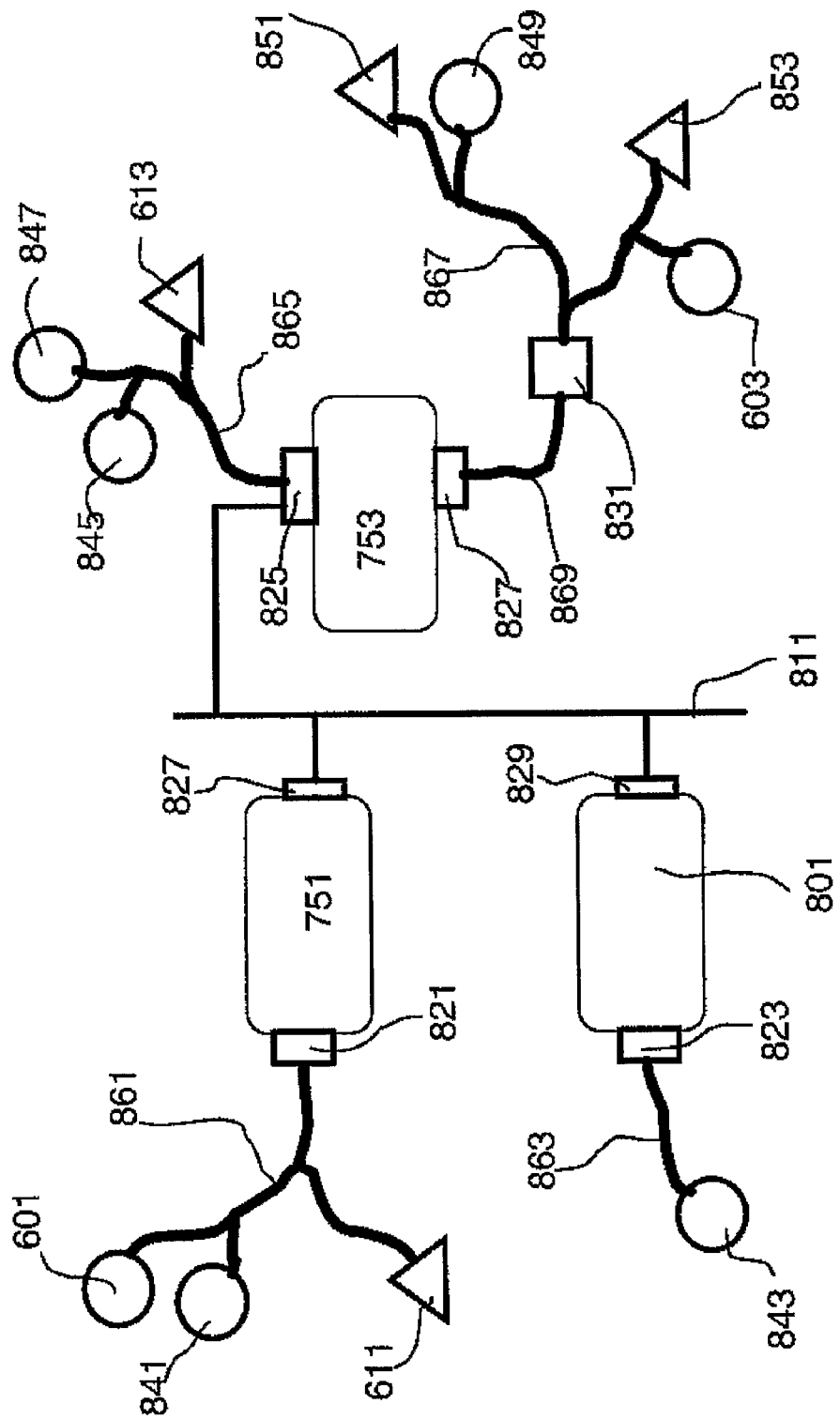
FIG. 8 illustrates a distributed service including three ECU's and a wiring network.

In FIG. 8, the implementation of the service described in FIG. 7 has been extended with a wiring definition. The bus topology and the way sensors and actuators are linked to the different ECU are now specified. ECU 751, 753 and 801 are linked to network 811 through connectors 827, 825 and 829 respectively.

Sensors and actuators 601, 841, 611 are linked to ECU 751 through connector 821 and cable 861. Connector 831. links cable 867 to cable 869 so that for instance actuator 603 is connected to ECU 753 through connectors 831 and 827. Sensors and Actuators connectors are not represented in the figure for the purpose of simplicity. Also, no ground connections are represented, they would simply consist in connections between ECU, sensors, actuators to ground locations through cables or simple wires.

When such a description is tested inside outline 417, this allows verifying that no wires lack in the specification of the wiring. The interface of 417 will be specified at the level of the sensors and actuators connectors. In that case, it is possible to simulate all the components, in order to validate specifications. It is also possible to interface a simulated part with a real ECU. This issue is discussed in FIG. 11.

Figure 9:
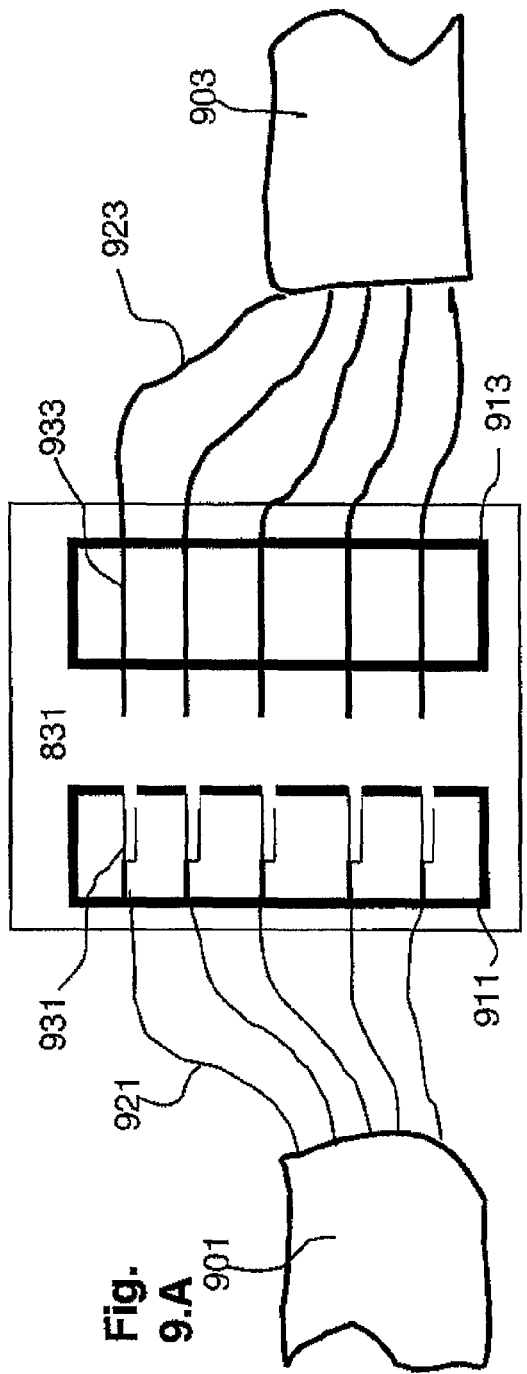
FIG. 9 illustrates a connector interface.
Figure 9:
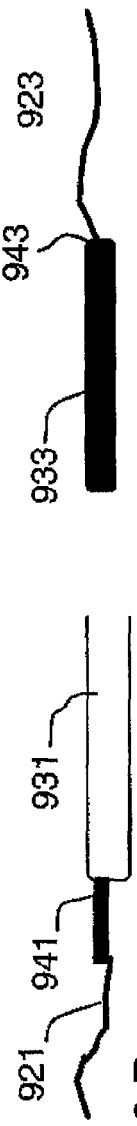
Figure 9:
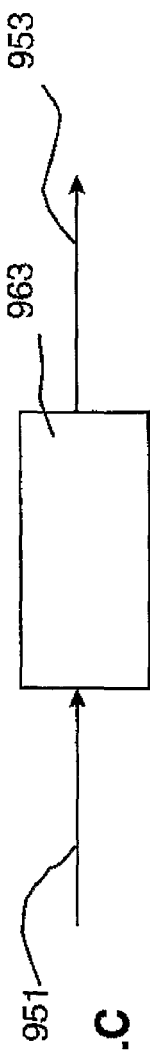

In FIG. 9, which comprises parts 9A to 9C, we focus on the definition of a connector and how a connector can be modeled for the purpose of validating its specification and later on its implementation.

In FIG. 9.A, outlines 901 and 903 represent cables, which gather together wires, e.g. wire 921 in cable 901 and wire 923 in cable 903. Connector 831 is composed of male connector 913 and female connector 911. In the figure, male and female connectors are not plugged in. Pin of female connector 931 corresponds to pin of male connector 933.

In FIG. 9.B, we focus on male and female connector pins 933 and 931, and explain how they are linked to wires 923 and 921 through contacts 943 and 941.

In FIG. 9.C, we represent the interpretation of a contact during validation at the modeling level. Wire 921 is interpreted as dataflow 951, wire 923 is interpreted as dataflow 953 and the contact between male and female connector pins is interpreted as function 963 with input dataflow 951 and output dataflow 953.

In case of a normal and fault free contact, function 963 may be implemented as the identity. In case of a faulty connection, function 963 may be a constant or random function depending on the contact failure to be a short cut or an instable contact.

Figure 10:
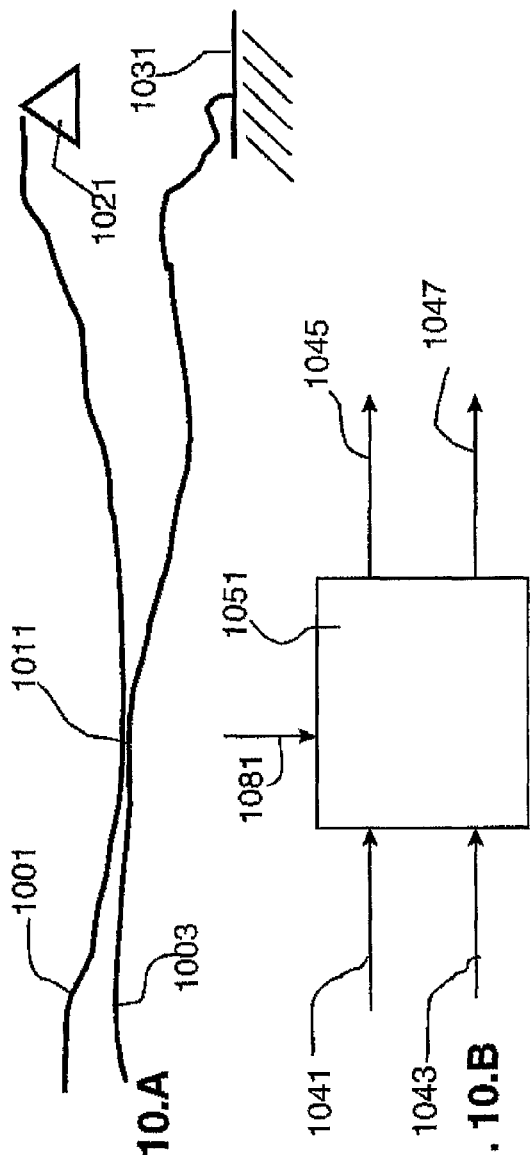
FIG. 10 illustrates the modeling of faults at the electrical level.
Figure 10:
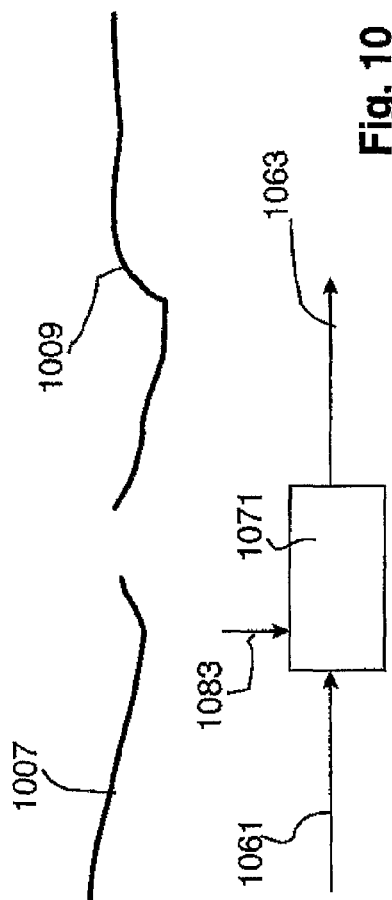
Figure 10:
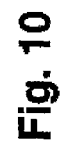

In FIG. 10, which comprises parts 10A to 10D, we discuss the implementation of fault injection which are used e.g. for the purpose of testing fault tolerant functions. In FIG. 10.A, wires 1003 and 1001 are very close to each other and they are in contact at point 1011, resulting in a short cut to ground 1031 for wire 1001, which provides power to actuator 1021.

In FIG. 10.B, the cable containing wires 1001 and 1003 is interpreted as a function with input 1041, and 1043 and output 1045 and 1047. One end of 1001 is interpreted as 1041 and the other end of 1001 is interpreted as 1045. Similarly, on end of wire 1003 is interpreted as 1043 and the other end as 1047. The cable containing wires 1001 and 1003 is interpreted as function 1051. The short cut to ground may be interpreted as an implementation of 1051 of the form of a constant function which yields 0 (interpretation of 0 A. intensity) to actuator 1021, whatever the input is. This interpretation will be operational only in the case where a short cut will be injected in function 1051 through flow 1081, corresponding to the case where we inject a fault for the purpose of validation in presence of a fault.

In FIG. 10.C, we represent an open circuit. Wires 1007 and 1009 form together a wire that has been broken. The non-broken end of 1007 is interpreted as input flow 1061 in FIG. 10.D, and the non-broken end of 1009 is interpreted as output flow 1063. The wire itself is interpreted as function 1071. In case of an open wire and in case the current is normally going from 1061 to 1063, the open wire effect is to set 1063 to a special bottom value interpreting electric open circuit and propagating this value to the consumer of 1063. Such a behavior of 1063 will only happen when a fault profile corresponding to an open circuit will be injected in 1063 through flow 1083.

So FIGS. 9 and 10 show how each component (cable, male and female connectors) can be interpreted as functions and dataflow to perform validations before their physical implementation is made. In the context of automotive systems, the electric network is relatively simple, loop free and a dataflow interpretation is possible whereas this is not possible in the most general case. Also, the fault model can be a simplification of the behavior of the actual electrical circuit. The only thing we need to guarantee is that the fault model is larger than the actual system faults set.

In FIG. 11, the design process of a service and the different steps of validation are described. During the advance phase design, no validation is possible till the elaboration of a first model of a feature. So, once the Use Case specification 1101, the behavioral specification 1003 consisting of a behavioral automata, the functional specification 11 05 indicating which functions are running in each state of that behavioral automata are built, it is then possible to model each function in order to get a model of the service. Once this Model is obtained, its input and output are "in principle" exchanges with sensors, actuators and other services.

At this step it is possible to generate automatically a test plan and a test model has described in FIGS. 4 and 5. In that case, the environment loop may take as input and output the input and output of the models. This excludes for instance the integration of drivers for command and capture. In case of a door locking service for a vehicle, possible input may be a formatted message of locking request from the user and possible output may be a command of a relay to lock the vehicle doors. The model inserted in block 417 may be of the form as presented in FIG. 2. Timings at this step are roughly estimated, although it's already possible to estimate timing requirements at the Use Case level and at the functional level. However, timings at this step will not be validated from a physical architecture.

The validation at this level is called "Model in-the-loop" 1171. It can be performed using a simulation workshop, e.g. "Matlab/Simulink. In that case, each function is specified in the form of an executable model under Simulink and each behavioral automata is specified in the form of an executable model under Simulink/Stateflow. The formalism allows specifying all scheduling interfaces between the different functions.

Then, at the following step, it is possible to write the application software: the software that implement the service, given high level input and output, which are formatted by the low level software. In the application software, functions and control automata are distributed in tasks that are to be scheduled by an operating system. If we either substitute the operating system with a model of the operating system or accommodate the operating system execution in the modeling environment used during validation 1171, it is then possible to validate the applied software by substituting the pieces of model in validation 1171 with corresponding pieces of applied software. This corresponds to validation step 1173 also called software in-the.loop.

Afterwards, drivers are specified. They turn low level, physical signal into high level logical signal and conversely depending on the fact they correspond to sensor or actuator drivers. Once they are specified in step 1111, they can be modeled together with their corresponding sensors and actuators. It is then possible to extend the model-the-loop simulation 1171, to a simulation 1177 including the drivers and/or sensors and actuators. In case only the drivers are included in the model, the sensors and actuators are part of the environment loop, which means they do not need to be formalized, only captures and commands relationship need to be modeled. In case, the sensors and actuators models are included in the validation, the environment contains a model of the links between related actuators and sensors, for instance, if a sensor is to test whether a lock has been correctly operated by an actuator, the link between that actuator and that sensor will be a model that given the open position of the actuator will send an unlocking position to the sensor and conversely. A way to get such a model is to model the physical behavior of each component.

Practically, the case where sensors and actuators are in the environment loop is the most useful at this step because it is sufficiently detailed to test that the service functions are properly specified. Moreover, getting a proper model of sensors and actuators may be difficult, and our purpose is to validate that the command or the captured information are well treated. However, even if the sensors and actuators are not properly modeled at this stage of the design process, the range of sound commands and captures need to be specified, both in space and time. Once, the drivers and components characteristics are specified, the low level drivers are implemented, partly as software components, partly as hardware components, in step 1113.

It is then possible to iterate the Software in-the-loop, in a validation stage 1181 that includes now the low level software and its scheduling. In design step 1121, ECU and networks are chosen and the services functional descriptions are mapped over different ECU. At first, the message set over the different busses need not be implemented. Each ECU is emitting a set of messages on each bus to which it is connected, to other connected ECU. Once the mapping is performed, it is possible to validate each service, step 1183, described in the form of FIG. 7.

Figure 13:
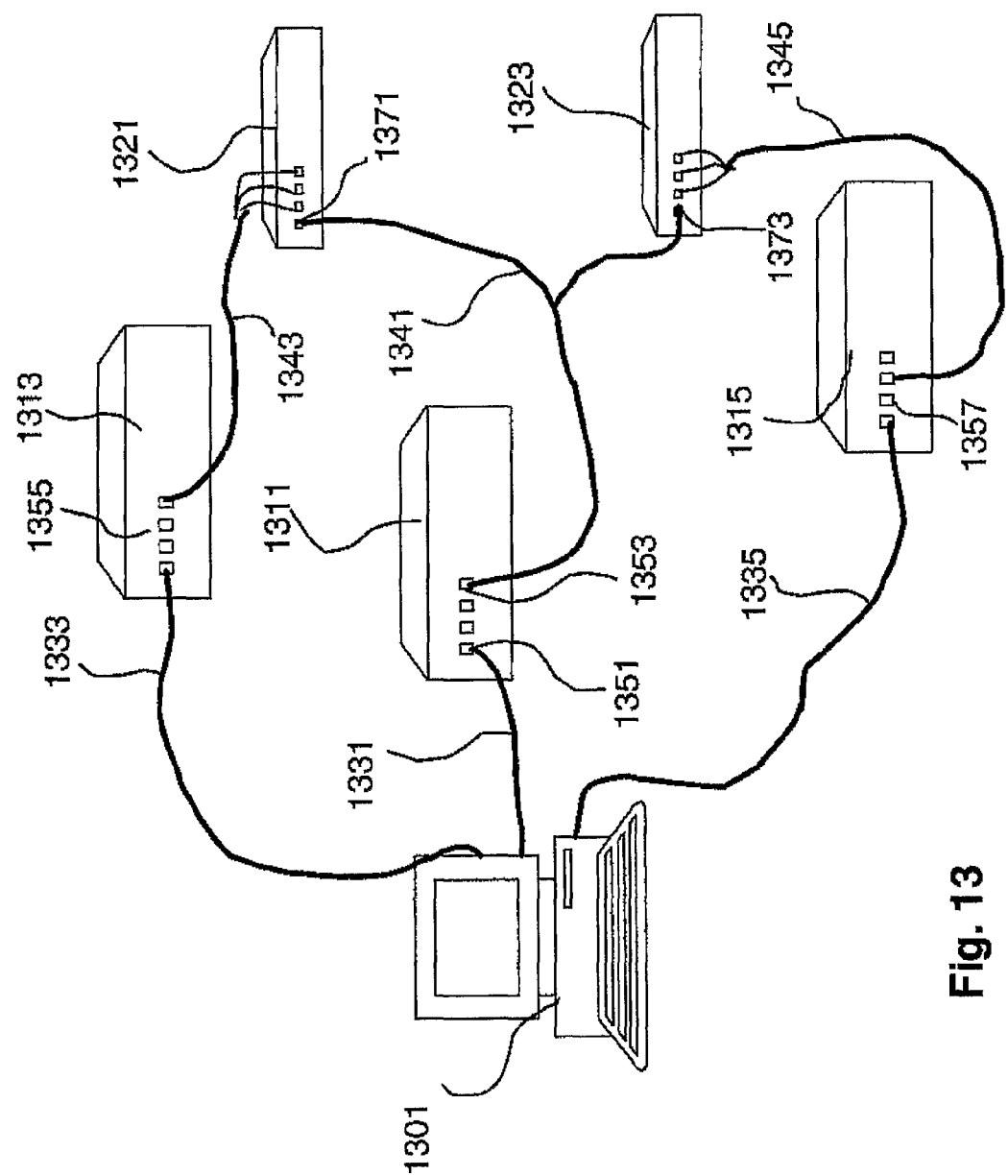
FIG. 13 illustrates a hardware in-the-loop testing environment.

In design step 1123, the message sets for each bus is specified, and the validation 1153 may include the low level software for messaging, together with the low level software for communication and network management. Also, once the ECU are specified, they are also implemented and Hardware in-the-loop can be performed, either for all ECU together, or for few ones, they others being simulated on a PC connected to the networks. This is illustrated in FIG. 13.

In design step 1131, the components (sensors, actuators, ECU) are mapped geometrically on a vehicle map and the wiring is designed. Interpreting wires and components connectors as described in FIG. 9, it is then possible to extend the interpretation of outline 417 in FIG. 4 to the implemented service together with its wiring. This Model in-the-loop test is performed in validation step 1185. It is again possible to retest the software in this new framework, and Hardware in-the-loop testing can be executed with the actual target wiring.

In the last design step, free connectors are specified, together with their modeling as explained in FIG. 9 and again the overall models and pieces of implementation can be tested at the modeling, software implementation and hardware implementation level.

Figure 12:
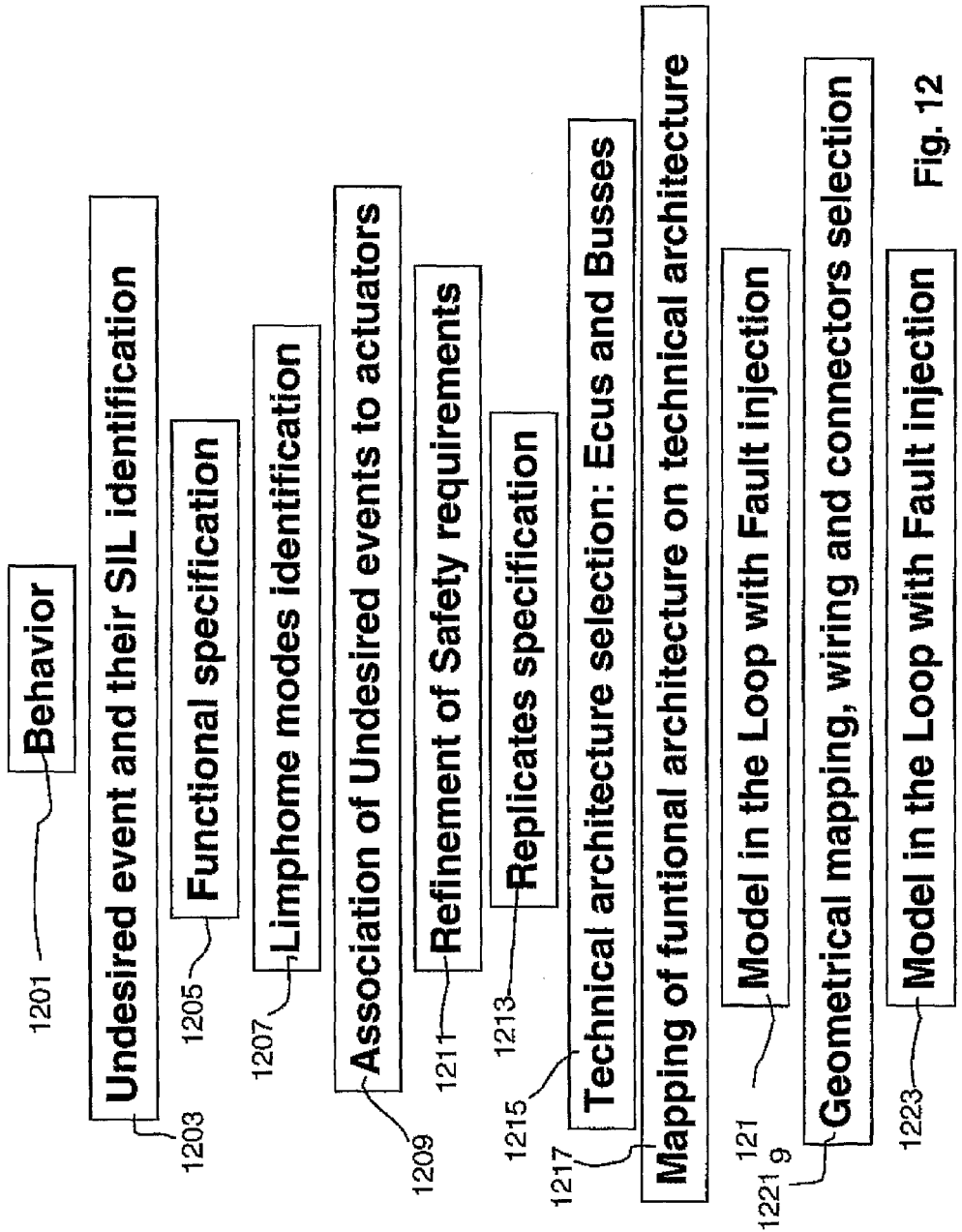
FIG. 12 illustrates the use of a design process for a safety critical system.

In FIG. 12, we address the specific development process for a safety system. The process is made of the following steps, once Behavior description (1201) is performed, under the form of a list of Use Case (1101 in FIG. 11) and a behavior specification (1103 in FIG. 11)

1 Identification of undesirable events and their gravity (1203)
2 Functional specification of the system built with its real or virtual sensors and actuators (1205)
3 Description of limp-home modes (1207)
4 Association of undesirable events with real or virtual actuators (1209)
5 Refinement of undesirable events on the functional architecture (1211)
6 Redundancy introduction together with safety requirements refinement (1213)
7 Hardware architecture definition (1215)
8 Mapping of functions on electronic control units (1217)
9 Validation of the fault tolerance of the resulting electronic architecture (1219)
10 Geometrical mapping of physical components and wiring (1221)
11 Validation of the fault tolerance of the resulting electrical-electronic architecture (1223)

This process is not intended to be linear. A few loops are hidden in the presentation. For instance, step 6 may be implemented through different ways which may occasion many reworks. Also, different hardware architectures may be investigated in step 7, as the goal is to find the less expensive architecture under given fault tolerant requirements. In step 8, different mapping will be investigated, especially if step 9 proves that a mapping is not satisfactory and requires some more work. Also, in step 10, different location of nodes may be investigated.

The main purpose of our description is to illustrate steps 9 and 11. The way the safety analysis is performed is out of purpose for us so we recall the different steps for the purpose of completeness and in order to relate steps 9 and 11 to a self-content design process.

1. Identification of Undesirable Events and Their Gravity.

This step is well known step of Functional Failure Analysis (FFA) which is a ssical part of safety analysis. The result of FFA for a system is the identification of undesirable events together with the severity of the consequences when the said events occur.

2. Functional Specification of the System Built with Its Real or Virtual Sensors and Actuator.

At this stage, we can refine the definition of design fault which was already mentioned earlier. A design fault is a fault made in the functional specification.

3. Description of Limp-Home Modes:

Description of modes is complementary to the functional architecture. A system can be described as composed of a control-automata, e.g. Statechart, that triggers a dataflow [Fuchs98]. At the highest level, the automata should implement system modes: initialization, nominal mode, limp-home modes and the behavior to switch from a mode to another.

For instance, in the case of a car braking system, if the front left brake is not functioning and the other brakes work properly, braking will result in a loss of stability of the vehicle which is worse than no braking at ail in many cases. So, in that case, a reliable limp-home mode will consist in braking with front right and rear left brakes with adapted braking pressure for each: in that case, the vehicle speed will decrease subsequently and the vehicle will remain stable.

In a critical system, limp-home modes will mostly consist in providing a degraded service in case the nominal mode is not available due to some fault. This is the step where we start in 11.

4. Association of Undesirable Events with Real or Virtual Actuators and State Transitions:

In our process we consider only a subset of the FFA result, for each undesirable event, we consider the involved actuators, the actuators of which failure will raise the undesirable event, all other actuators functioning normally.

For instance, for a vehicle braking system, we can consider the undesirable event "lack of stability during braking". This may be possible if one of the actuator is not braking while the three others are. If our target is that the system be tolerant to one fault, an analysis may lead for instance to the conclusion that the lack of stability is due to a failure of one of the actuators. In that case, we would associate "lack of stability during braking" to each of the brake actuators alone. If now we consider the undesirable event "no braking while braking requested", then it is clear that none of the actuator received a sound command so that this undesirable event is obviously associated with the set of all brakes.

But suppose that our braking system is triggered by a control-automata and that the braking request is a transition of the automata which leads to state "brake". If the transition is not executed properly, the undesirable event will occur even if each brake is working properly. So an undesirable event may be attached to a state transition if the said state transition failure may raise the said undesirable event. At the end of this step each undesirable event is attached to one or few subsets of all actuators or state transitions results, together with a severity.

A possible reference for the severity levels is provided in norm [IEC61508]. Depending on the severity, fail-silent or fault-tolerance levels in the presence of one or two faults are expected together with expected probabilities of failure acceptance.

In the case of an electrical braking system, the actuators are requested to be "fail-silent", i.e., it should be proved that a brake can be put in a physical state where it does not function. If a probability is expected, we will say that, the electrical brake can be put in a physical state where it does function except in a probability p per unit of time, p being very low for instance $10^{-8}$ per hour.

5. Refinement of Undesirable Events on the Functional Architecture:

Given at beginning a functional architecture made of sensors, actuators and functions, and a dataflow, some dataflow modeling an electrical current, a battery being modeled as a sensor.

We have identified in previous step a) undesirable events and linked actuators. The design engineer can then indicate whether he expects fail-silent or fault-tolerant or no requirement from the different input flow of each actuator depending on the undesirable events associated with said actuator in isolation.

For instance, in case of a brake system, as a requirement that a brake alone should not fail exists, the braking force command of each brake can be specified fault-tolerant. But the designer may simply consider that a fail-silent requirement is sufficient if the brake system can react sufficiently quickly after a failure is detected. This tagging is depending on the functional architecture and its properties, which is an input in our method.

Iteratively, we then determine the safety requirements of functions and actuators by applying the same analysis to each function and each relevant undesirable event for said function. If a function produces a dataflow which, through the functional architecture, is contributing directly to the control of a set of actuators, then we should consider for that function all the undesired events which are linked to a subset of said set of actuators to establish the safety requirements on said function and on the input of said function. Moreover, we have to consider also for that function each constraints on its outputs coming from a previous safety analysis.

6. Redundancy Introduction Together with Safety Requirements Refinement:

Then, for each function, an implementation mode of the function is selected to implement the replicates and voting mechanism required, depending on the safety requirements generated so far.

The resulting functional architecture is larger than the initial one. Note that if no Fault-tolerance or Fail-silent requirement is specified, the functional architecture is unchanged at this step.

7. Hardware Architecture Definition

At this step, we simply specify the electronics control units and networks that will implement the system. In a context where the safety analysis is quantitative, expected failure rates per unit of time are expected.

8. Mapping of Functions on Electronic Control Units:

At this step, the functions are mapped on electronic control units as explained in step 1121 of FIG. 11 for instance.

9. Validation of the Fault Tolerance of the Resulting Electronic Architecture:

This validation is performed by a testing environment as in FIG. 4. The novelty is that we now test whether the behavior is sound in presence of faults. So each component is equipped with a fault injection port, like ports 1081 and 1083 in FIG. 10. Then a test injection plan is specified. In case we want to test the behavior in the presence of one fault, the validation environment as in FIG. 4 is executed for each fault of each component in the architecture. The faults that can be injected are: wire open, short cut, as mentioned in FIG. 10, but also e.g. network open, frame not sent, ECU reset, . . . etc. The list is not limitative as it may extend depending on the components used in the system, but will mainly be restricted to electrical components and their interface.

Note that, as the faults are standards (open circuits, short circuit, reset of ECU) their modeling is standard so that the validation can be performed automatically, from the introduction of fault models to the execution of the validation with fault injection. The order of testing faults is of no importance as the validation is executed for each fault occurrence.

10. Geometrical Mapping of Physical Components and Wiring:

At this step the wire paths, connectors and cables between electronic control units, batteries, sensors, actuators and more generally electrical components is specified, following a classical engineering process.

11. Verification of the Fault Tolerance of the Resulting Electrical-Electronic Architecture:

This is the same step as in step 9 except that we include now an exhaustive wiring description. Fault injection is then added for all new connectors and pieces of wiring added at step 10.

In FIG. 13, we describe a testing environment apparatus. It is composed of ECU 1321 and 1323, under test, and numerous components participating in the environment simulation for these ECU. Such an apparatus allows validating ECU 1321 and 1323 correctly meet their functional requirements. Also this figure will illustrate the implementation of hardware in-the-loop environment as mentioned in the introduction and in FIG. 11.

Personal computer 1301 is interfaced with ECU 1321 through acquisition and command board 1313, so that a model executed on PC 1301 is interfaced with ECU 1321. Board 1313 is operated through a bus 1333 from PC 1301. The interface between ECU 1321 and board 1313 is performed through cable 1343 and connectors 1355 and 1371.

Similarly Personal computer 1301 is interfaced with ECU 1323 through acquisition and command board 1315, so that a model executed on PC 1301 is interfaced with ECU 1323. Board 1315 is operated through a bus 1335 from PC 1301. The interface between ECU 1323 and board 1315 is performed through cable 1345 and connectors 1357 and 1373.

ECU 1321 and 1323 are connected through a local area network 1341 and many other ECU may be connected to this bus. It is then necessary to simulate the other ECU on bus 1341 in order to perform a real hardware in-the-loop simulation. This is mandatory in practice, because ECU usually include limp home modes in case a failure of the network occurs so that, with the network, only part of the behavior of each ECU would be tested, which is not acceptable.

So Board 1311 is the network interface allowing simulating the lacking ECU on network 1341. This board is connected to PC 1301 through bus 1331. Of course, if bus 1341 is an optimized embedded bus, busses 1331, 1333 and 1335 suffer no constraints. They may be for instance VME busses.

When testing ECU 1321 and 1323, it is sufficient to isolate their outlines in model as formed on FIG. 8, and then to execute the rest of the model on PC 1301. Of course, all the physical interfaces between the acquisition and command boards 1311, 1313 and 1315 need to be configured, but this stuff mastered at current state of the Art. For instance, Dspace tools provide solutions. As a particular case of FIG. 13, a unique ECU test plan can be generated from models of FIG. 4 and 8 by isolating the outline of the ECU in FIG. 8 and consider on one hand the ECU and on the other hand the testing environment of the ECU for a given service or a given set of services.

Figure 14:
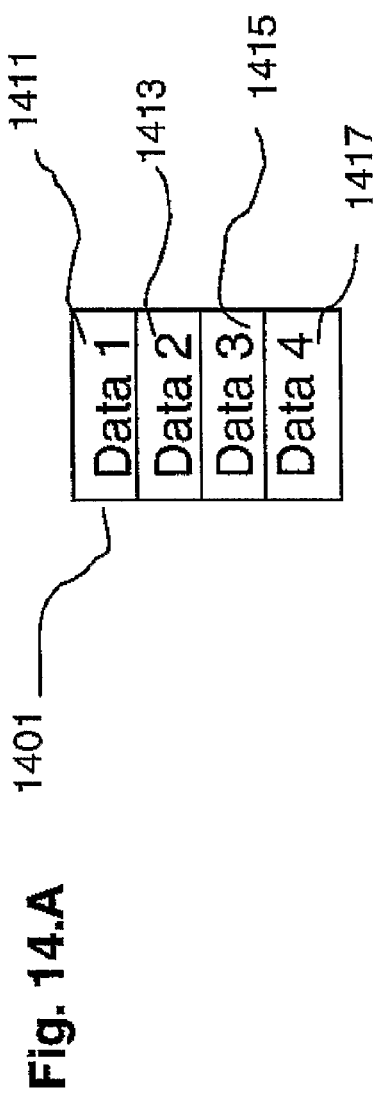
FIG. 14 illustrates a different specification maturity for a frame in a local area network, e.g. CAN bus.
Figure 14:
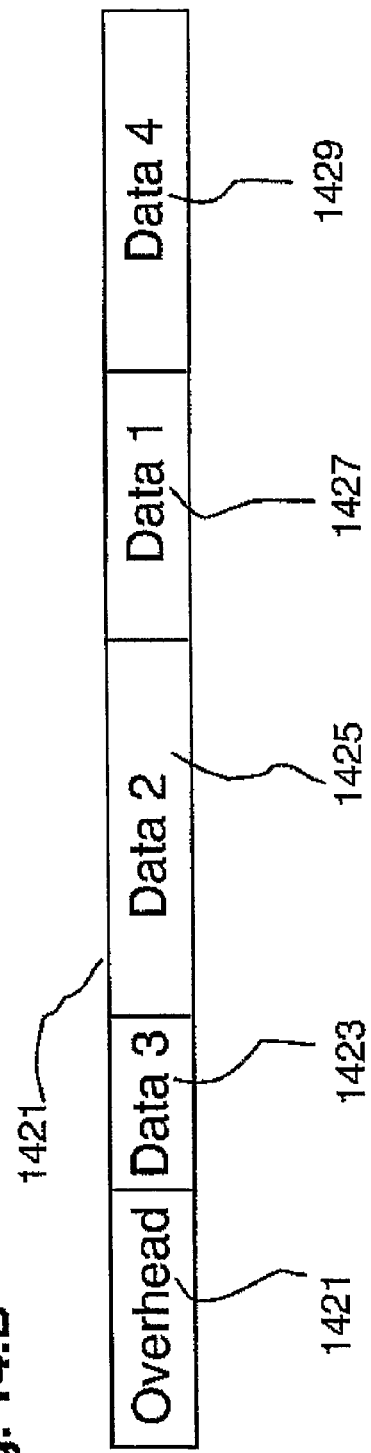

In FIG. 14, we describe different steps of the Message set modeling and conception. In the embedded domain, busses are mainly described in terms of frames that are emitted and received according to different protocols. For embedded applications, CAN (Controller Area Network) [CAN] is widely used.

A first step is to specify the content of each frame, without special attention to the type of the carried dataflow as shown in FIG. 14.A. This is represented in outline 1401, where records 1411, 1413, 1415 and 1417 for respectively data 1, data 2, data 3 and data 4 are simply listed without any constraint as for the data size or location in the frame.

A second step consists in considering a real frame layout as in FIG. 14.B. Then, the overhead of the frame together with the precise location of each data is specified. For instance, Data 2 at location 1425 will be written from bit 2 of third octet to bit 5 of fourth octet of the frame. Also it is required to know whether the insertion in the frame is little endian or big endien.

A third step of modeling may consist in modeling the API allowing writing and reading data in a frame.

A fourth and last step would be to interpret the assembler code for the bus driver hardware interface. In practice, the third and first steps are of greatest practical use.

FIG. 16 illustrates the case where we interweave testing automata for several services. Up to now, we have focused on the specification of the testing environment for one service. We now address mixing the testing automata for several services.

In the case where we test a set of services that share common Use Cases, synchronization must be performed between the testing automata of these services. The test must be interwoven, with the constraint that common Use Cases are synchronously executed for all the services under test. This is not difficult to perform. However, this testing approach is valid under the condition that Use Cases having transverse impact have been well identified at a preliminary stage.

A good example of a service that needs to be validated together with other services is energy management. This service should be tested transversally with other services in order to see whether the power requested by each service is actually available from the power management service.

In that case, a use case shared by many services of a vehicle is typically "user starts the engine". For the power management service, this results in a system response like "alternator is running and power is commuted to the alternator power line". Let's consider that outline 1601 is an excerpt of the power management service testing plan and that transition 1623 is a user request to start the engine of a vehicle, the engine start check being performed in state 1615. States 1611, 1613 and 1617 correspond to other checks for other states of the power management service.

For another service like climate control, the engine start could result in a system response like "cooling starts" if the cooling has been requested whereas the car engine was still stopped. Assume outline 1603 is an excerpt of the cooling service testing plan and that transition 1641, like transition 1623, corresponds to the engine start request.

When mixing both services, the respective testing automata can be merged as in outline 1605. Transitions 1623 and 1641 are merged into transition 1675, because they are synchronized around a single user request. Assuming other requests are independent, the testing automata of both services are translated to merged testing automata as follow:

State 1611 is translated to state 1651,
State 1631 is translated into state 1653, transition 1671 corresponds to a transition of the cooling service allowing reaching state 1631.
State 1613 is translated into state 1655.
Transition 1621 is translated into transition 1673.
Transitions 1623 and 1641 are merged and translated into transition 1675.
State 1617 is translated into state 1659.
State 1635 is translated into state 1635.
Transition 1625 is translated into transition 1677 and transition 1643 is translated into transition 1679.

The semantics of the translation is identity of operations except in the case where identical transitions are merged. The way states of initial testing automata are mixed seems random. In practice, the latency constraints of both plans drive this mix. Of course some synchronization is needed so that the same time elapses in each unitary testing automata between two synchronized states.

All this is made under the assumption that transitions 1621, 1625 on one hand and transitions 1643 on the other hand are completely independent. So we have shown how several services can be validated accordingly with their respective unitary validation environment. This is possible under the assumption that user requests from the different services are either independent or can be synchronized.

Also the initial state of all services under test must be the same. The testing automata of all the services that are simultaneously validated starts at a common initial state for all those services and the initial state of all the unitary testing automata are merged in a unique initial state in the merged testing automata.

The method of the present invention may be implemented by a computer that is configured to implement the various steps of the method and thereby ultimately to output automatically a validation environment for use in proving a design proposed for an embedded electrical system. The validation environment would preferably be recorded in a computer readable memory device that would then subsequently be used by a computer aided design tool to validate designs proposed for the or each service concerned, such a design tool comprising either the same or a different computer.

The method steps may be commercialized in particular by being recorded onto a computer program product, for example in the form of a computer readable memory like a CD, DVD or equivalent, or directly on to the hard disk of a design tool. The method might then be recorded on that memory device as a computer program readable and executable by the computer/design tool concerned.

Glossary: (following approximately the order of introduction of the definitions)

Use Case: description of an elementary scenario of use of a service. A Use case comprises a context definition, a user request, a system response and may also include performance requirements, e.g. end-to-end execution time.

User request: a user request to a service

System response: the response of a service related to a user request and given the means of the system implementing that service.

Use Case Context: context, e.g. status of mechanical and electrical components, in which a use case me apply.

Moore automata: an automata with no commands triggered on transitions

Behavioral automata: a control automata, which states and transitions mimic a succession of user requests and related system responses.

State: a state of an automata, e.g. triggering a system response in a behavioral automata. Several states may execute the same functions. In a behavioral automata, a state execute a system response.

Skeleton validation environment: a template of a model of a test environment, which includes the basic outlines and dataflow for the test or validation environment.

Transition: a transition of an automata, e.g. implementing a user request in a behavioral automata. Several transitions in a behavioral automata may execute the same user request Functions: are the elementary executable components implementing user requests, system responses and other actions triggered by any automata. A function has input and output dataflow and some behavior triggering output value in function of input value. During the design phase of a system, functions may eventually be implemented as pieces of software or pieces of hardware.

testing request:: is a function associated with a user request. A testing request is interfaced with a service description and stimulates that service input so as to activate its related user request in that service implementation.

state checking function: is associated to a state of a behavioral automata. It is interfaced with the output of the service under test, and should be implemented so as to yield a positive test result when said service go through its related state and a negative result otherwise.

Initial conditions block: initialization of all the dataflow corresponding to the status of all the system components in the initial state of the validation.

Environment loop: an execution loop between models and/or Hardware-in-the-Loop testing environment and/or ECU and/or wiring and/or components so that the overall system is self-content for execution and simulation.

testing environment or validation environment: an environment interfaced with the service under test and/or the system of the service under test for the purpose of validation that service and/or that system at different steps of the design process.

testing automata: a part of the testing environment detailing user interactions and context switches for the service under test.

Service under test: the service for which a validation environment is developed

Skeleton validation environment: a particular embodiment of the validation environment in which all functions a part from the service under test are the identify function. The purpose of the skeleton is to generate the complex dataflow of the validation environment together the related testing automata. Once the skeleton is generated automatically, it can be completed and validated during a model in-the-loop phase.

Hardware in-the-loop testing: Drivers are interfaces with low level signal and high level software variables. In the case of a network driver, the driver scope includes inserting and extracting data in network frames, triggering emission and reception of frames. In the case of an analogue digital input, associates driver put the analogue signal in a digital format given a sampling rate and a data format.

Mapping of a service: during the implementation of a service on a hardware architecture composed of ECU and networks, the service components are mapped on different ECU, e.g. pieces of software implementing the service on these ECU; and sensors and/or actuators implementing the service are attached or mapped to different ECU.

Connector: a component inserted in the wiring architecture for the purpose of partitioning the wiring in small components that will be easier to manufacture and assembly. Also interface between wiring and ECU. An ECU may have a few connector, each one interfacing the ECU with an different wiring.

Cable: a set of wired gathered together for the purpose of easy assembling, e.g. in a vehicle manufacturing process.

Wiring: a design step corresponding to the design of wires, connectors and relate electrical components. Electronic parts are not generally included. Wiring is also a set of linked cables and connectors, e.g. the wiring of a door in a vehicle or the wiring of the multimedia function in a vehicle cockpit.

REFERENCES

AHU74:
Aho, Hopcroft J. E., Ulmann J. D., 1974, The Design and Analysis of Computer Algoithms, Addison Wesley, Reading, Mass.
CAN:
CAN specification, Bosch
Fuchs98:
SAE paper 980199 available online:
www4.informatik.tu-muenchen.de/publ/papers/FEMPS98.pdf
Harel87:
Elsevier Science Publisher B.V (North Holland), 1987
Rushby95:
Computer Science Laboratory, SRI International, Menlo Park, Calif.
IEC61508:
Publisher: International Electrotechnical Commission (IEC), 1998.

Simu:

Matlab/Simulink and Matlab/Stateflow: (main commercial product available supporting simulation of mechatronic systems) http:/lwww.mathworks.com HIL& Test:

Dspace, Hardware in-the-loop: (many relevant papers about and sample of hardware in-the-loop and testing techniques the state of the art) http://www.dspaceinc.com/ww/en/inc/home.htm

The invention claimed is:

1. A method of designing a validation environment for a service implemented by an embedded electrical system, the method including:
assigning to said service one or more user requests and system responses of the electrical system;
assigning to said service a behavioral automata, said behavioral automata fixing allowed sequencing of said user requests and said system responses;
automatically generating a skeleton validation environment for said service, in the form of a program executable on a simulation tool, said skeleton validation environment including a testing automata produced from a traversal of said behavioral automata, a model of initial conditions, models of said user requests, models of system response accuracy, an environmental model and dataflow and control flow which assemble said models together, and said skeleton validation environment covering all user requests and resultant system responses of said service; and
recording said skeleton validation environment in a computer readable memory device for use by a design validation tool.

2. A method according to claim 1, including assigning to each user request a function implementing each user request and assigning to each system response one or more functions implementing each system response, a dataflow of said skeleton validation environment being built using said functions of user request and system response.

3. A method according to claim 2, including assigning to said service a black box interface, the black box interface includes an input and output which correspond to an input and output of at least one of the functions of user request and system response implementing the service, and interfacing the output of said service black box with a skeleton input and a skeleton output with the input of said service black box and completing and correcting skeleton and service specification in a simulation environment to yield a validation result.

4. A method according to claim 3, including outputting a validated model which includes the skeleton validation environment for said service and a validated model of the service.

5. A method according to claim 1, including substituting a model of the service with a software implementation of the model.

6. A method according to claim 1, including substituting a model of the service with a software and hardware implementation of the model and embedding said skeleton validation environment on a testing platform interfaced with said hardware implementation.

7. A method according to claim 1, including a systematic injection of faults for all replicated objects in a fault tolerant system, which includes a brake-by-wire system in a vehicle.

8. A method according to claim 1, including assigning a skeleton validation environment for several services sharing at least one user request and mixing said skeleton validation environments of said service implemented by an embedded electrical system to yield a validation environment for said several services.

9. A non-transitory computer readable storage medium including program code stored thereon for performing the method of claim 1 when said program code is run on a computer including a processor.

* * * * *